(12) United States Patent
North et al.

(10) Patent No.: US 10,802,555 B2
(45) Date of Patent: *Oct. 13, 2020

(54) INFORMATION HANDLING SYSTEM THERMALLY CONDUCTIVE HINGE

(71) Applicant: Dell Products L.P., Round Rock, TX (US)

(72) Inventors: Travis C. North, Cedar Park, TX (US); Mark A. Schwager, Cedar Park, TX (US); Austin M. Shelnutt, Leander, TX (US); John T. Morrison, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 312 days.

This patent is subject to a terminal disclaimer.

(21) Appl. No.: 15/952,519

(22) Filed: Apr. 13, 2018

(65) Prior Publication Data

US 2019/0317574 A1 Oct. 17, 2019

(51) Int. Cl.
*G06F 1/20* (2006.01)
*G06F 1/16* (2006.01)
*H01L 23/427* (2006.01)
*H05K 7/20* (2006.01)

(52) U.S. Cl.
CPC .......... *G06F 1/206* (2013.01); *G06F 1/1616* (2013.01); *G06F 1/1681* (2013.01); *G06F 1/203* (2013.01); *H01L 23/427* (2013.01); *H05K 7/20336* (2013.01); *H05K 7/20381* (2013.01); *G06F 2200/203* (2013.01)

(58) Field of Classification Search
CPC .................... G06F 1/1681; G06F 2000/203
See application file for complete search history.

(56) References Cited

U.S. PATENT DOCUMENTS

| | | | | |
|---|---|---|---|---|
| 5,170,634 A | | 12/1992 | Squires | |
| 5,646,822 A | * | 7/1997 | Bhatia | F28D 15/02 165/104.33 |
| 5,718,282 A | * | 2/1998 | Bhatia | F28D 15/02 165/104.33 |
| 5,781,409 A | * | 7/1998 | Mecredy, III | F28D 15/02 16/223 |
| 5,796,581 A | * | 8/1998 | Mok | G06F 1/203 165/104.33 |
| 5,818,693 A | | 10/1998 | Garner et al. | |
| 5,822,187 A | * | 10/1998 | Garner | F28D 15/02 361/679.27 |
| 5,832,987 A | * | 11/1998 | Lowry | F28F 13/00 165/86 |

(Continued)

*Primary Examiner* — Robert J Hoffberg
(74) *Attorney, Agent, or Firm* — Zagorin Cave LLP; Robert W. Holland

(57) ABSTRACT

A portable information handling system transfers thermal energy associated with operation of a CPU from a main housing portion to a lid housing portion with thermal conduction through a hinge assembly that rotationally couples the main and lid housing portions to each other. For example, thermal conduits insert into a hinge body and transfer thermal energy across the hinge body through a thermally conductive interface, such as the hinge body itself, thermal grease disposed in the hinge body, a liquid that fills a cavity of the hinge body shared by the thermal conduits, and a vapor chamber integrated in the hinge body.

20 Claims, 23 Drawing Sheets

(56) References Cited

U.S. PATENT DOCUMENTS

| | | | |
|---|---|---|---|
| 5,880,929 A | 3/1999 | Bhatia | |
| 5,910,883 A | 6/1999 | Cipolla et al. | |
| 5,975,195 A * | 11/1999 | Lowry | G06F 1/203 165/104.33 |
| 6,069,791 A * | 5/2000 | Goto | G06F 1/203 165/104.33 |
| 6,078,499 A * | 6/2000 | Mok | G06F 1/1616 165/185 |
| 6,097,596 A * | 8/2000 | Cipolla | G06F 1/203 16/223 |
| 6,141,216 A | 10/2000 | Holung et al. | |
| 6,175,493 B1 * | 1/2001 | Gold | G06F 1/203 174/15.2 |
| 6,185,102 B1 * | 2/2001 | Shou | G06F 1/203 16/223 |
| 6,288,896 B1 * | 9/2001 | Hsu | G06F 1/182 165/104.33 |
| 6,341,062 B1 | 1/2002 | Patel | |
| 6,377,452 B1 * | 4/2002 | Sasaki | G06F 1/203 165/104.33 |
| 6,493,226 B1 * | 12/2002 | Noguchi | G06F 1/203 165/104.33 |
| 6,507,488 B1 * | 1/2003 | Cipolla | G06F 1/203 165/104.33 |
| 6,507,490 B2 * | 1/2003 | Sasaki | G06F 1/203 16/223 |
| 6,550,531 B1 | 4/2003 | Searls et al. | |
| 6,771,498 B2 * | 8/2004 | Wang | G06F 1/203 165/104.33 |
| 6,795,312 B2 | 9/2004 | Narakino | |
| 7,116,552 B2 * | 10/2006 | Wu | G06F 1/203 361/679.26 |
| 7,254,019 B2 | 8/2007 | Leu | |
| 7,447,029 B2 | 11/2008 | Lai et al. | |
| 7,656,665 B2 * | 2/2010 | Lin | G06F 1/203 361/700 |
| 7,701,716 B2 | 4/2010 | Blanco, Jr. | |
| 7,791,876 B2 | 9/2010 | Moore | |
| 8,208,250 B2 | 6/2012 | Mongia | |
| 8,675,363 B2 | 3/2014 | Croojimans | |
| 9,007,759 B2 | 4/2015 | Su | |
| 9,134,757 B2 | 9/2015 | Nishi | |
| 9,182,794 B2 | 11/2015 | Rivera | |
| 9,412,418 B2 | 8/2016 | Hu | |
| 9,545,030 B2 | 1/2017 | Nikkhoo | |
| 9,625,960 B1 | 4/2017 | Ent et al. | |
| 9,639,126 B2 | 5/2017 | Senyk | |
| 9,872,384 B2 | 1/2018 | Braley | |
| 9,891,673 B2 | 2/2018 | Lee et al. | |
| 9,980,412 B2 | 5/2018 | Qiu | |
| 10,401,926 B1 * | 9/2019 | North | G06F 1/1616 |
| 10,579,112 B2 * | 3/2020 | North | G06F 1/203 |
| 10,579,113 B2 * | 3/2020 | North | G06F 1/206 |
| 2008/0130221 A1 | 6/2008 | Varadarajan et al. | |
| 2009/0025910 A1 | 1/2009 | Hoffman et al. | |
| 2009/0207569 A1 | 8/2009 | Tsunoda | |
| 2009/0219673 A1 | 9/2009 | Tamura | |
| 2011/0301778 A1 | 12/2011 | Liang | |
| 2014/0063712 A1 | 3/2014 | Chung | |
| 2014/0160657 A1 | 6/2014 | Morrison | |
| 2015/0346784 A1 | 12/2015 | Delano et al. | |
| 2016/0118317 A1 | 4/2016 | Shedd et al. | |
| 2016/0212887 A1 | 7/2016 | Nikkhoo | |
| 2018/0262013 A1 | 9/2018 | Morin | |
| 2018/0284856 A1 | 10/2018 | Shah | |
| 2019/0317575 A1 * | 10/2019 | North | G06F 1/206 |
| 2019/0317576 A1 * | 10/2019 | North | G06F 1/203 |
| 2019/0317578 A1 * | 10/2019 | North | G06F 1/206 |

* cited by examiner

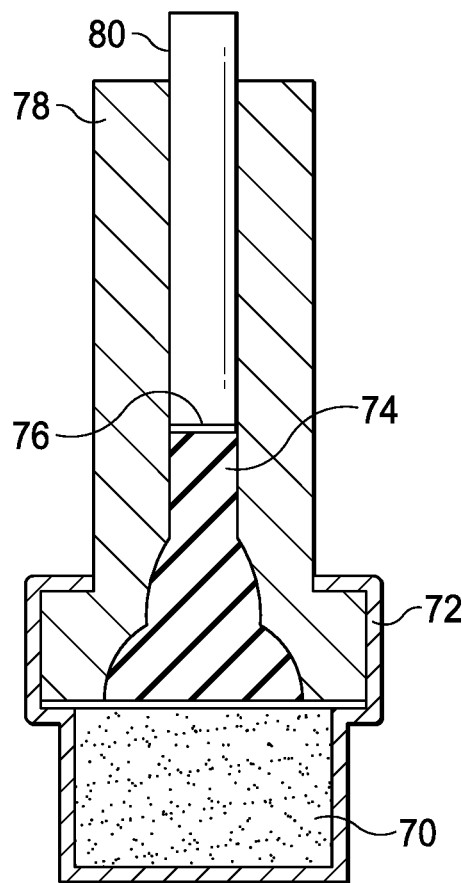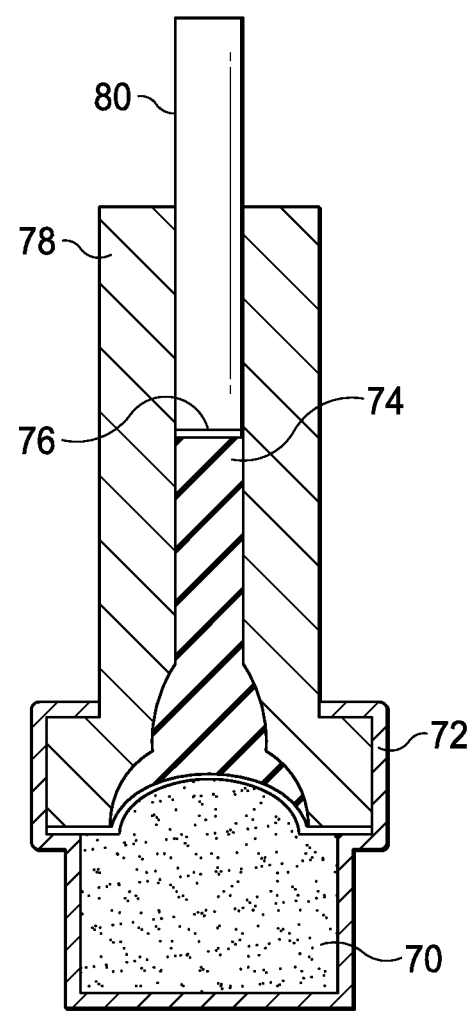
FIG. 3A        FIG. 3B
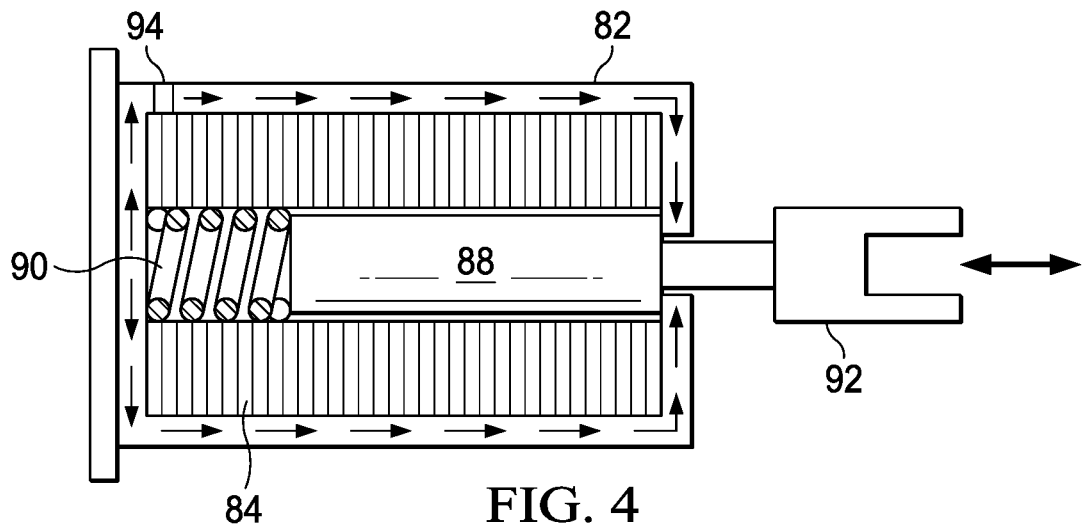
FIG. 4

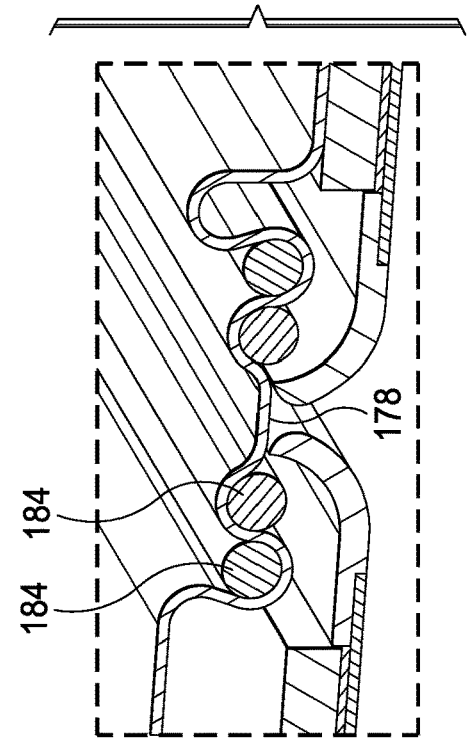
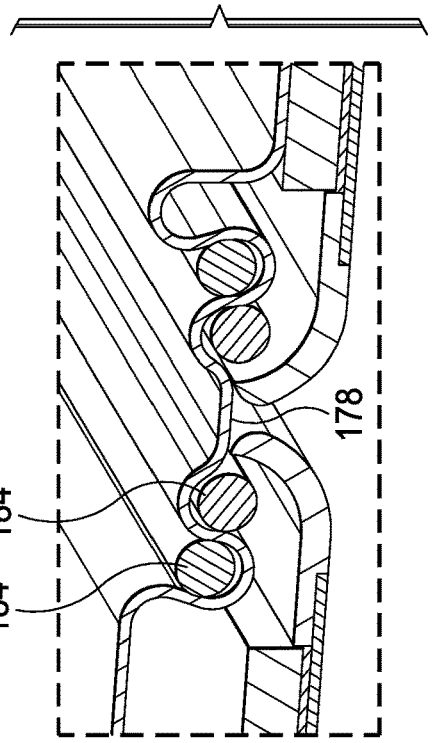
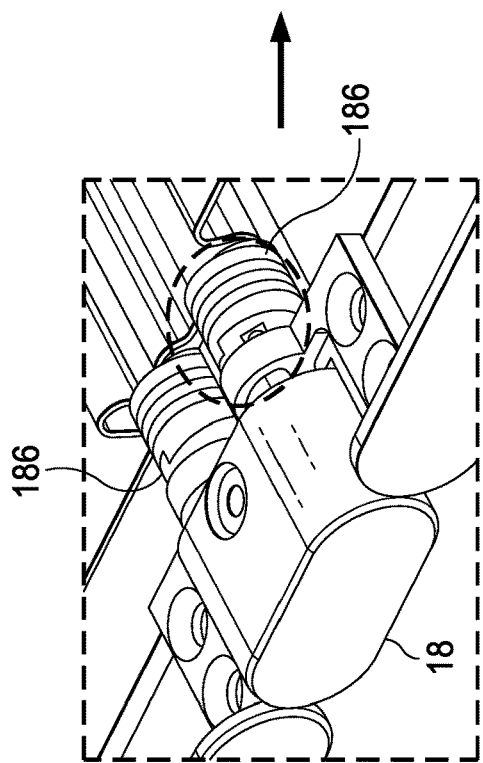
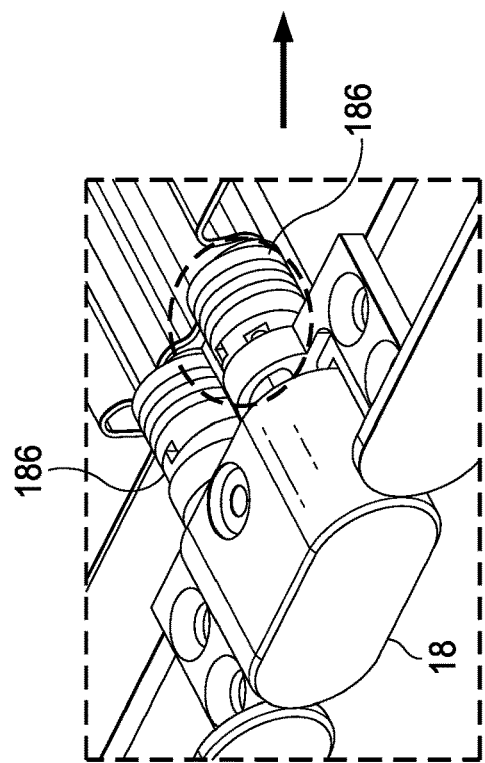
FIG. 37A
FIG. 37B

INFORMATION HANDLING SYSTEM THERMALLY CONDUCTIVE HINGE

CROSS REFERENCE TO RELATED APPLICATIONS

U.S. patent application Ser. No. 15/952,525, entitled "Information Handling System Housing Integrated Vapor Chamber" by inventors Travis C. North, Mark A. Schwager, Austin M. Shelnutt, and John T. Morrison, filed on Apr. 13, 2018, now published as U.S. Patent Application Publication 2019/0317575, describes exemplary methods and systems and is incorporated by reference in its entirety.

U.S. patent application Ser. No. 15/952,528, entitled "Information Handling System Housing Thermal Conduit Interfacing Rotationally Coupled Housing Portions" by inventors Travis C. North, Mark A. Schwager, Austin M. Shelnutt, and John T. Morrison, filed on Apr. 13, 2018, now issued as U.S. Pat. No. 10,401,926, describes exemplary methods and systems and is incorporated by reference in its entirety.

U.S. patent application Ser. No. 15/952,536, entitled "Information Handling System Dynamic Thermal Transfer Control" by inventors Travis C. North, Mark A. Schwager, Austin M. Shelnutt, and John T. Morrison, filed on Apr. 13, 2018, now published as U.S. Patent Application Publication 2019/0317576, describes exemplary methods and systems and is incorporated by reference in its entirety.

U.S. patent application Ser. No. 15/952,538, entitled "Graphite Thermal Conduit Spring" by inventors Travis C. North, Mark A. Schwager, Austin M. Shelnutt, and John T. Morrison, filed on Apr. 13, 2018, now issued as U.S. Pat. No. 10,579,112, describes exemplary methods and systems and is incorporated by reference in its entirety.

U.S. patent application Ser. No. 15/952,543, entitled "Graphite Thermal Conduit Spring" by inventors Travis C. North, Mark A. Schwager, Austin M. Shelnutt, and John T. Morrison, filed on Apr. 13, 2018, now issued as U.S. Pat. No. 10,579,113, describes exemplary methods and systems and is incorporated by reference in its entirety.

U.S. patent application Ser. No. 15/952,551, entitled "Information Handling System Thermal Fluid Hinge" by inventors Travis C. North, Mark A. Schwager, Austin M. Shelnutt, and John T. Morrison, filed on Apr. 13, 2018, now published as U.S. Patent Application Publication 2019/0317578, describes exemplary methods and systems and is incorporated by reference in its entirety.

BACKGROUND OF THE INVENTION

Field of the Invention

The present invention relates in general to the field of portable information handling system thermal management, and more particularly to an information handling system thermally conductive hinge.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems process information with processing components disposed in a portable housing. Generally, portable information handling systems are configured to support operations free from external peripheral devices and/or cabled connections. For example, portable information handling systems typically integrate a display for presenting information as visual images, an input device for accepting inputs from an end user, a wireless communication device to communicate with a network, and a battery to power processing components when external power is not available. Convenient operations without interfacing to external resources allow end users to readily access information on the go and away from an enterprise or home work environment.

Portable information handling systems generally have a tablet configuration or a convertible configuration. A tablet configuration typically integrates a display on one side of a planar housing to cover processing components disposed in the planar housing. Often, a touchscreen display provides the only integrated input device for a tablet by accepting touches at a user interface presented on the display. Tablet information handling systems' relatively flat housings and minimal input device provide a thin and light weight system, however, interactions that involve end user inputs tend to be more time consuming in the absence of a keyboard input device. Convertible information handling system configurations generally include multiple housing portions rotationally coupled to each other by a hinge. The housing portions rotate 90 degrees relative to each other from a closed position to a clamshell position that presents a display integrated in a lid housing portion at a viewing orientation relative to a base housing portion that rests on a desktop or other support surface. Some convertible information handling systems rotate the housing portions 360 degrees relative to each other to expose the display in a tablet footprint having the base portion underneath. An advantage of the convertible configuration is that a physical keyboard can integrate in the base housing portion to provide an enhanced end user input device.

One difficulty with convertible information handling system configurations is that rotationally coupling housing portions to each other tends to increase the thickness of the system. Typically, a lid housing portion integrates the display and interfaces with a main housing portion that integrates processing components, such as a central processing unit (CPU), random access memory (RAM), a graphics processor unit (GPU) and persistent storage. A hinge assembly couples to the lid and main housing portions to support rotation of the housing portions relative to each other. A keyboard integrates in the main housing portion and covers the processing components. The housing portions and hinge assembly have to provide sufficient robustness to withstand multiple cycles of opening and closing without twisting and torsional forces introduced by rotation placing excessive mechanical stress on the display and processing components.

Another difficulty with convertible information handling system configurations is that processing component power dissipation is limited by thermal constraints that include a maximum temperature associated with the each processing component and a maximum temperature of the housing surface. In particular, CPU operation tends to dissipate power at a concentrated location that can result in excessive thermal conditions. Generally, if a CPU reaches a temperature threshold, the CPU will throttle power consumption by operating at a lower clock speed that dissipates less power. Typically, lower CPU clock speeds will reduce thermal conditions within the housing so that excessive external housing surface temperatures do not cause end user discomfort. However, as CPU clock speed reduces, processing speeds also decrease, resulting in slower system response.

Larger portable information handling system housings generally support more powerful processing components because more room is available within the housing to separate the components and dissipate excess thermal energy. Larger-sized portable housings often have room to include active cooling systems, such as a cooling fan that blows a cooling airflow over the CPU. Additional thermal dissipation is often provided by a heat sink coupled to the CPU, especially where the heat sink has vertical space to extend fins into the cooling airflow. Generally, the cooling fan draws in cooling airflow at an intake vent, passes the cooling airflow across the CPU and heat sink, and exhausts the cooling airflow out an outtake vent that blows away from the end user.

Active cooling systems tend to increase the size of a portable housing and also increase power consumption. Typically, low profile information handling system housings lack room to support active cooling. Instead, such systems tend to rely upon passive cooling to dissipate excess thermal energy. For example, heat pipes provide thermal energy transfer from hotspots, such as at the CPU, towards an area where the thermal energy may passively transfer to the external environment. Generally, passive cooling limits thermal dissipation to CPUs of 5 W power, although specific housing configurations vary depending upon size, thickness and materials. In some instances, low profile housing passive thermal transfer may support higher transient CPU power consumption levels, however, extended operations at high power dissipations tends to eventually result in CPU throttling and decreased performance. Although new low power CPUs perform well at lower clock speeds, the full potential of such CPUs at expected transient power dissipations can call for 10 W or more of passive thermal transfer capability.

SUMMARY OF THE INVENTION

Therefore, a need has arisen for a system and method which enhances passive transfer of thermal energy from a low profile information handling system housing.

A further need exists for a system and method which dynamically controls passive thermal transfer at an information handling system.

A further need exists for a system and method that distributes thermal energy through a hinge for rejection at a rotationally coupled housing portion.

A further need exists for a system and method that integrates a vapor chamber into an information handling system housing for rejection of thermal energy at the housing surface.

A further need exists for a thermal conduit that transfers thermal energy between rotationally coupled housing portions.

In accordance with the present invention, a system and method are provided which substantially reduce the disadvantages and problems associated with previous methods and systems to passively transfer thermal energy from an information handling system housing. Thermal energy generated by power dissipation at a first housing portion, such as execution of instructions on a CPU, is transferred through a thermal conduit to a second rotationally coupled housing portion for rejection to an external environment. In various embodiments, the thermal conduit passes through one or more hinges rotationally coupling the housing portions to each other and has the amount of thermal energy that is transferred managed by altering thermal characteristics of thermal conduits and/or thermal dissipation devices integrated in the housing portions. For instance, one or more vapor chambers integrated in one or more housing portions alters an internal pressure to adapt a saturation point for fluid phase change, thus adjusting the efficiency of thermal transfer across the vapor chamber. Management of thermal transfer at housing portions provides a tool for maintaining housing portion outer surfaces and internal components within a temperature threshold.

More specifically, an information handling system processes information with processing components disposed in a housing, such as a CPU and memory that coordinate execution of operating system and application instructions. Dissipation of power to run the processing components generates thermal energy that heats the processing components. In order to run the processing components at full power dissipation, thermal energy is transferred from the processing components and dissipated across a surface area to decrease the amount of temperature increase for a given thermal energy release. For example, thermal energy released by a CPU is transferred to a vapor chamber that uses phase change of a fluid between liquid and gas states to efficiently dissipate the thermal energy. In one embodiment, the information handling system has two or more portions rotationally coupled to each other through one or more hinges and a thermal energy dissipation device, such as a vapor chamber, integrated in a housing portion that does not include the CPU. For instance, a main housing portion includes a CPU and other processing components disposed under a keyboard and a lid housing portion includes a display that presents information processed by the CPU. Thermal energy generated by the CPU is transferred to the lid housing portion for dissipation and rejection to the external environment. A thermal conduit that transfers the thermal energy may include liquid tubes that pump heated liquid through a hinge, a layered graphite cable or spreader that conducts heat in plane across the housing portions, or the hinge body itself. In one embodiment, the amount of thermal energy transferred is managed by adjusting the pressure within one or more vapor chambers to change the saturation point of the fluid in the vapor chamber, thus adapting the efficiency with which thermal energy is transferred. Thermal energy transferred to a lid housing portion is dissipated with a thermal spreader or vapor chamber in the lid housing portion. In one embodiment, a vapor chamber is defined with layered sheets of material that form the lid housing portion so that thermal energy is rejected through the lid housing portion outer surface.

The present invention provides a number of important technical advantages. One example of an important technical advantage is enhanced passive transfer of thermal energy from a low profile information handling system. Thermal energy rejects more efficiently from an information handling system with a greater surface area exposed to an external environment. Further, thermal energy rejects more efficiently from a vertically raised surface as thermal energy rises. Thus, transferring thermal energy to a lid housing portion improves passive thermal cooling as the lid housing portion generally doubles the surface area from which thermal energy is rejected and is raised in a vertical orientation to hold a display integrated in the lid housing portion in a viewing position.

Another example of an important technical advantage is dynamic control of passive thermal energy rejection to manage information handling system component and housing temperatures. For example, manipulating the pressure within a vapor chamber adjusts the saturation point of a fluid in the vapor chamber, thus adapting the efficiency with which thermal energy is dissipated across the vapor chamber. Active control of pressure in one or more vapor chambers manages temperatures at locations throughout an information handling system. For instance, if a lid housing portion outer surface reaches too high of a temperature, increasing the pressure within a vapor chamber of the lid housing portion decreases thermal energy transfer to lower the outer surface temperature. In one embodiment, pressure management is automated with a wax motor that melts to increase pressure when temperatures reach a defined threshold.

Another example of an important technical advantage is distribution of thermal energy between housing portions across a hinge that rotationally couples the housing portions to each other. For example, a hinge body provides a thermal transfer path with thermally conductive material disposed in the hinge body, such as a liquid, a vapor chamber or the hinge body itself.

Another example of an important technical advantage is distribution of thermal energy between rotationally coupled housing portions independent of the hinges coupling the housing portions to each other. For example a graphite sheet or plural layers of graphite sheets provide excellent in plane thermal conduction to transfer thermal energy between housing portions. Graphite formed in the shape of a torsion spring interfaces between housing portions with minimal disruption of information handling system operation, such as by wrapping around a hinge pin or shaft, or routing through a slot defined by parallel bars that maintain a minimal bend radius to protect the thermal transfer material from cracking or breaking.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIGS. 3A and 3B depict a side cutaway view of a wax motor actuator that controls thermal transfer at an information handling system;

FIG. 4 depicts a side cutaway view of a solenoid motor actuator that controls thermal transfer at an information handling system;

FIGS. 37A and 37B depict an example of tension adjustments applied by the tensioning bar clutch assembly;

DETAILED DESCRIPTION

An information handling system transfers thermal energy between rotationally coupled housing portions to improve thermal dissipation and rejection. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
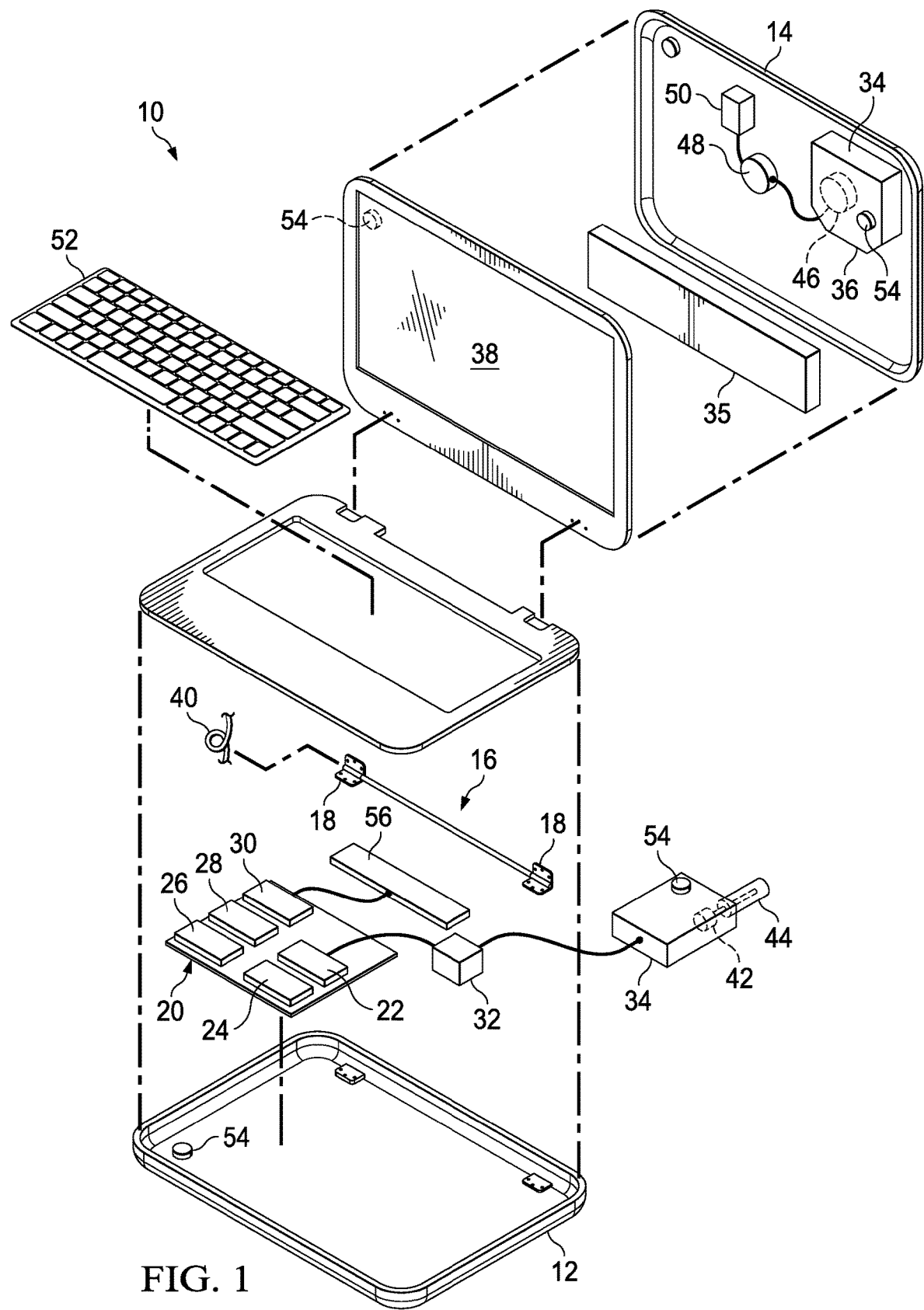
FIG. 1 depicts a block diagram of a portable information handling system configured to dissipate thermal energy across rotationally coupled housing portions.

Referring now to FIG. 1, a block diagram depicts a portable information handling system 10 configured to dissipate thermal energy across rotationally coupled housing portions. In the example embodiment, a main housing portion 12 and lid housing portion 14 of substantially the same size and dimensions rotationally couple to each other with a hinge assembly 16 having first and second hinges 18 at opposing corners of the housing portions. In various embodiments, hinges 18 support rotation of housing portions 12 and 14 relative to each other by 90, 180 and up to 360 degrees, such as to support a clamshell configuration or tablet configuration. In the example embodiment, main housing portion 12 contains processing components that process information and generate heat as a byproduct of the power dissipated through the processing components. For example, a CPU 22 executes instructions of an operating system and one or more applications stored in a solid state drive (SSD) 26 and retrieved to random access memory (RAM) 24 to process information, such as visual information for presentation at a display 38. A chipset 28 includes processors and embedded code that manages interactions between CPU 22 and physical devices, such as to apply power, charge a battery 35 or process information into pixel values presentable at a display. For example, chipset 28 typically includes or cooperates with an embedded controller 30 that manages operating system boot and accepts end user inputs from a keyboard 52. In alternative embodiments, alternative configurations of processing components may be used to provide desired functionality, as is known in the art of processing information. Although the example embodiment illustrates thermal transfer across housing portions, in alternative embodiments, the thermal transfer techniques described herein may be used in tablet systems or in other types of physical devices to transfer thermal energy within a single housing portion.

In the example embodiment and similar systems, processing components tend to generate heat in concentrated areas of main housing 12. CPU 22, in particular, generates concentrated thermal energy that, if not properly managed, will exceed temperature constraints and damage processing capabilities. Conventional information handling systems attempt to dissipate the thermal energy from the location of CPU 22 with a heat sink 32 and heat pipes made of thermally-conductive material. For example, heat sink 32 couples directly to CPU 22 to absorb thermal energy and includes fins to transfer the thermal energy to air in a more efficient manner by increasing the surface area from which thermal energy can be rejected. As thermal energy dissipates away from CPU 22, the temperature of CPU 22 is reduced to allow operation at greater levels of power dissipation, such as at higher clock speeds that process information more quickly. If CPU 22 generates too much heat to efficiently dissipate away, CPU 22 typically throttles its operation to reduce processing speed, power consumption and heat generation. Generally, with passive thermal rejection through a heat sink, the temperature of CPU 22 will depend upon the space available for transfer of thermal energy to air within main housing portion 12. Concentrations of rejected thermal energy near the processor not only restricts power dissipation at CPU 22 but tends to create hot spots at the outer surface of housing 12 near CPU 22 that can cause end user discomfort.

In the example embodiment, a vapor chamber 34 integrates into main housing portion 12, such as by coupling to heat sink 32 or CPU 22, to spread thermal energy throughout main housing portion 12. Generally, vapor chamber 34 is a sealed chamber that includes a fluid, such as water, at a reduced pressure that lowers the saturation point at which the fluid transitions between liquid and gaseous states. Vapor chamber 34 uses phase transition energy characteristics to aid in thermal transfer. For instance, water absorbs thermal energy to transition from liquid to gaseous states while remaining at the saturation point temperature so that liquid located near CPU 22 absorbs thermal energy to support transition to the gaseous phase. Once in a gaseous phase, the fluid transports absorbed thermal energy away from CPU 22 more readily as a gas than as a liquid to release the thermal energy in a phase transition from gas to liquid distal CPU 22. The fluid then wicks back towards CPU 22, typically with the help of a mesh, to repeat absorption and transfer of thermal energy. On a system level, the effect of thermal transfer by vapor chamber 34 is to spread thermal energy across a greater area so that the hotspot near CPU 22 has a reduced temperature while the temperature across main housing 12 increases. Dissipation of thermal energy across a greater surface area offered by vapor chamber 34 also provides more efficient rejection of thermal energy from information handling system 10. For instance, in one example embodiment, vapor chamber 34 thermally couples to main housing 12 to provide additional thermal absorption and exposure at the outer surface of housing 12 for thermal rejection the external environment.

In order to further expand the external surface area that rejects thermal energy from information handling system 10, a second vapor chamber 34 integrates with information handling system 10 in lid housing portion 14 and interfaces with thermal energy from main housing portion 10 through a thermal conduit 40. Lid housing portion vapor chamber 34 includes a funnel base 36 so that when lid housing portion 14 rotates to a raised position, gravity forces the fluid in liquid form towards the interface with thermal conduit 40. As fluid in vapor chamber 34 transitions to a gaseous state, heat transfer with the fluid in a gaseous state for release across vapor chamber 34 at transition back to a liquid state. Funnel base 36 aids wicking of the fluid back to a heat source interfaced with thermal conduit 40 to encourage dissipation of thermal energy across lid housing portion 14. In addition, other masses associated with lid housing portion 14 may thermally interface with vapor chamber 34 to aid in absorption and rejection of thermal energy to the external environment. For example, battery 35 may thermally interface with vapor chamber 34 to absorb thermal energy. Alternatively, lid housing portion 14 may thermally interface with vapor chamber 34 to absorb and reject thermal energy. As the mass and surface area associated with absorption and rejection of thermal energy increase, the temperatures associated with various components of information handling system 10 at a given thermal energy state will remain lower.

One difficulty with dissipation of thermal energy across both housing portions 12 and 14 of information handling system 10 is that rejection of thermal energy from the outer surfaces of main housing portion 12 and lid housing portion 14 can increase temperatures to a point at which an end user may experience discomfort. For example, efficient thermal energy transfer from CPU 22 to main housing portion 12 may increase the bottom surface temperature so that a laptop resting on a lap would become uncomfortable, although the same laptop on a desktop surface or docking station would operate well within thermal constraints. Similarly, efficient thermal energy transfer through thermal conduit 40 to lid housing portion 14 can increase temperatures of the outer surface of lid housing portion 14 to a level that is not comfortable for an end user. In addition, battery 35 and display 38 are often themselves thermal energy sources that add thermal energy to lid housing portion 14 in certain circumstances and impose thermal constraints due to their operating limitations. For instance, a battery 35 of lithium ion construction tends to have a thermal limit of 40 degrees C. and tend to heat when charging. As another example, a display 38 of OLED construction generates thermal energy at different levels based upon the color and brightness of visual images so that the temperature of lid housing portion 14 may vary based upon heat output by display 38. Lid housing portion 14 temperature may be managed to remain below a limit of an OLED display 38 and also to aid in the presentation of visual images by adjusting temperature to provide desired presentation characteristics based upon the visual image to be presented.

In order to manage transfer of thermal energy across various portions of information handling system 10, a thermal controller 56 interfaces with one or more actuators to control thermal energy based upon temperatures sensed by temperature sensors 54 disposed across information handling system 10 and integrated with various processing components, such as CPU 22. In the example embodiment, thermal controller 56 is embedded code stored in non-transient flash memory and executed by embedded controller 30 of chipset 28. In alternative embodiments, thermal controller 56 may include a variety of hardware and software components distributed across information handling system 10, such as a driver of an operating system or option ROM of a device component. Thermal controller 56 monitors thermal conditions across information handling system 10 and actuates actuators to adjust thermal transfer so that thermal constraints are met. For instance, thermal controller 56 maintains the temperature of main housing 12 outer surface below a first threshold if accelerations indicate movement of information handling system 10, a second threshold if a lack of accelerations indicate information handling system 10 rests on a desktop, and a third threshold if a docking station is coupled that includes additional thermal absorption capabilities. In one example embodiment, thermal controller 56 allows full transfer of thermal energy through vapor chambers 34 and thermal conduit 40 until a temperature threshold is reached at lid housing portion 14, and then restricts thermal transfer to lid housing portion 14 to main the temperature below the threshold. Reducing thermal transfer to lid housing portion 14 tends to increase temperatures at main housing portion 12 so that thermal controller 56 may have to throttle CPU 22 to reduce the amount of thermal energy generated.

One way to manage thermal energy transfer throughout information handling system 10 is to use actuators controlled by thermal manager 56 to adjust the efficiency at which vapor chambers 34 and thermal conduit 40 transfer thermal energy. In one example embodiment, a solenoid 44 actuates a plunger 42 within a vapor chamber 34 to adjust the efficiency of vapor chamber 34 for transferring thermal energy. For example, if a temperature sensed at battery 35 reaches a threshold, thermal controller 56 actuates solenoid 44 to change the pressure within vapor chamber 34, thus changing the saturation point at which vapor chamber 34 transports thermal energy in a gaseous state. Increasing pressure within vapor chamber 34 increases the saturation point and thus the temperature at which a fluid in vapor chamber transitions from liquid to gaseous form so that thermal energy is translated across vapor chamber 34 less efficiently. Less efficient thermal energy transfer generally results in higher temperatures at the thermal hot spot, such as the location at which heat sink 32 interfaces with vapor chamber 34, and lower temperatures at locations distal the thermal hot sport, such as a location at which thermal conduit 40 interfaces with vapor chamber 34 to conduct thermal energy to lid housing portion 14. Thus, for example, increasing pressure in vapor chamber 34 such as by inserting plunger 42 into vapor chamber 34 to increase the pressure and saturation point, will result at a given CPU 22 power dissipation in a greater CPU 22 temperature and a reduced battery 35 temperature. Similarly, the temperature at the outer surface of main housing 12 will be less evenly distributed with a greater hot spot at CPU 22 as vapor chamber 34 loses efficiency at higher saturation points for transfer of thermal energy. Thermal controller 56 weighs sensed temperatures based upon operating conditions to adjust thermal transfers appropriately, such as to maintain thermal constraints associated with components (CPU 22, battery 35, display 38, etc.) and sensed conditions (accelerations, user presence, housing orientation, docking station resources, etc.).

Another example of vapor chamber 34 thermal efficiency management is depicted with vapor chamber 34 in lid housing portion 14 and its integrated microfluidic bladder 46. A microfluidic pump 50 interfaces with a microfluidic reservoir 48 to change the displacement of microfluidic bladder 46 within vapor chamber 34, thus altering the pressure and saturation point within vapor chamber 34. As an alternative, pump 50 and reservoir 48 may interface directly with vapor chamber 34 to change the amount of fluid in vapor chamber 34, thus change the pressure and saturation point of the fluid as the fluid in liquid form displaces space within vapor chamber 34. In the example embodiment, the availability of saturation point control in both vapor chambers 34 provides thermal controller 56 with a tool that not only manages the amount of thermal transfer between housing portions 12 and 14 but also the direction of thermal transfer. For example, a graphics controller disposed separate from chipset 28 and within lid housing portion 14 may generate considerable thermal energy when processing heavy loads, such as graphics associated with a game. In such a situation, thermal energy generated within lid housing portion 14 may exceed thermal energy generated in main housing portion 12 so that transfer of thermal energy from lid housing 14 to main housing portion 12 enhances graphics processing. The distribution of thermal energy may also change if external resources provide additional cooling at main housing portion 12, such as with the use of a base docking station that offers cooling underneath main housing portion 12. In such a situation, setting the vapor chamber 34 in lid housing portion 14 to have a low saturation point relative to the vapor chamber 34 in main housing portion 12 has the effect of creating a second hot spot where thermal conduit 40 couples to the main housing portion 12 vapor chamber 34. Thus, as thermal energy transfers through thermal conduit 40 from lid housing portion 14 to main housing portion 12, the thermal energy is more efficiently removed to allow operation of the graphics processing. In alternative embodiments, alternative arrangements for managing the amount and direction of thermal transfer may be used, such as those set forth in greater detail below.

Figure 2:
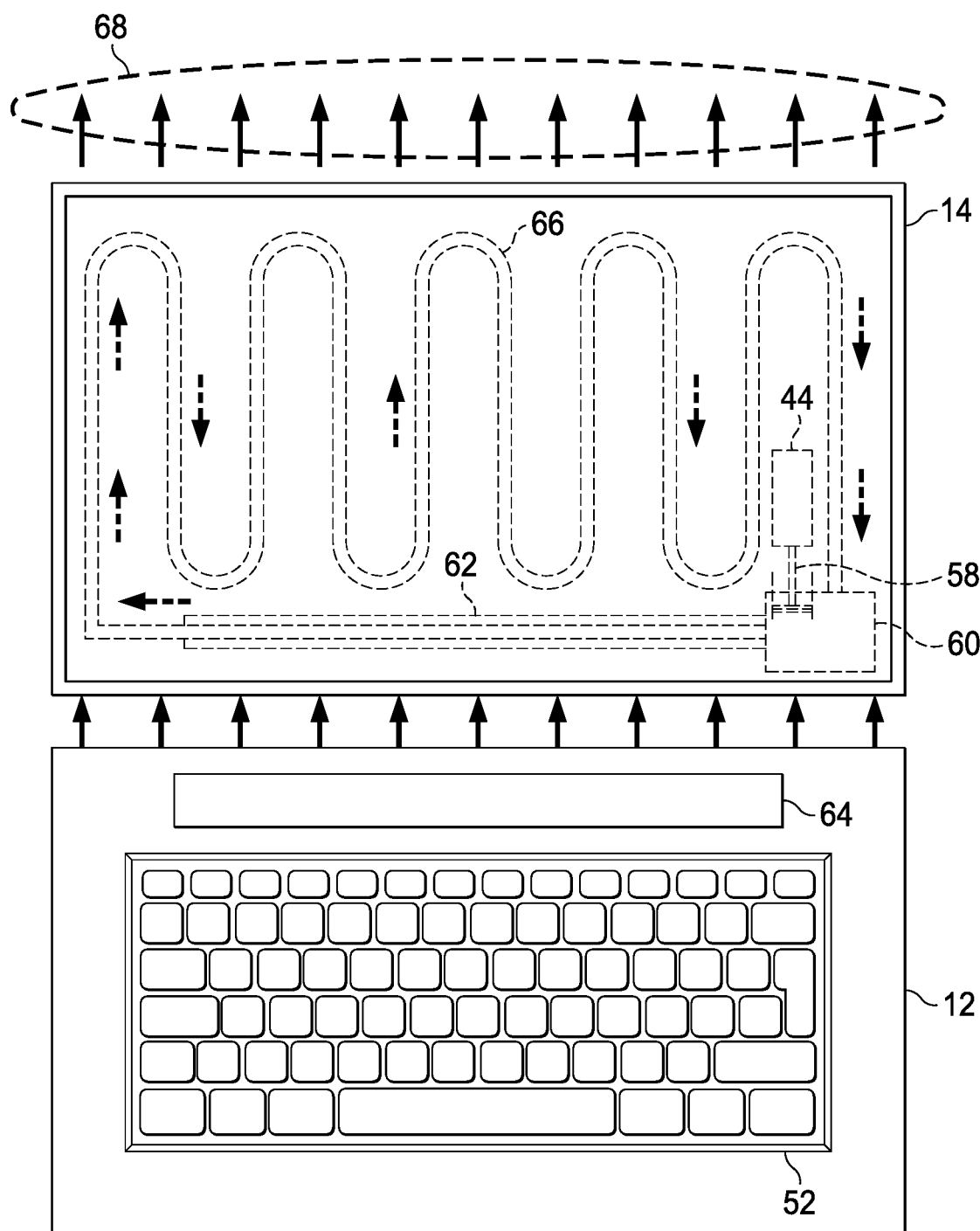
FIG. 2 depicts a cutaway view of an information handling system lid portion that illustrates an example embodiment for managing thermal transfer between housing portions.

Referring now to FIG. 2, a cutaway view of information handling system 10 lid portion 12 illustrates an example embodiment for managing thermal transfer between housing portions. In the example embodiment, vapor chamber 34 is configured as a loop heat pipe having an evaporator 62 that accepts thermal energy through a thermal interface 64 to evaporate the fluid from a gaseous to a liquid state and a condenser 66 that condenses fluid from a gaseous to a liquid state. The loop portion may be provided by tubing disposed in lid housing portion 14 or with channels formed in lid housing portion 14, such as channels cut in a plate or between two layers of sheet material that are sealed together. Thermal energy is absorbed during phase change to the gaseous state and released during phased change to the liquid state for rejection 68 to the external environment, such as through the surface area of the outer surface of housing portion 14. A compensator chamber 60 pools the condensed fluid in liquid form so that a piston 58 can adjust the volume of the vacuum system by changing its insertion position within compensator chamber 60 in response to an actuator 44, such as a solenoid. As pressure increases within, the saturation point increases to increase the temperature at which gas and liquid state changes occur and decrease the efficiency at which thermal transfer takes place. Reducing the efficiency of thermal transfer tends to decrease the distribution of thermal energy from main housing portion 12 to lid housing portion 14 to reduce the temperature at lid housing portion 14. Retracting piston 58 out of chamber 60 decreases the pressure and saturation point to increase thermal transfer efficiency and the temperature a lid housing portion 14. Thus, for example, outer surface temperatures, accelerations and user settings may be applied to adapt thermal distributions throughout information handling system 10. For instance, a system on a desktop interfacing through a peripheral keyboard may tolerate higher outer surface temperatures than a system folded into a tablet configuration that is experiencing movements associated with end user touches to the outer surface.

Referring now to FIGS. 3A and 3B, a side cutaway view depicts a wax motor actuator that controls thermal transfer at an information handling system 10. FIG. 3A of the example embodiment depicts the wax motor in a retracted position having wax expansion material 70 in solid form disposed against a cup structure 72 containing plug 74 with a diaphragm separating wax 70 from plug 74. An anti-chafing disc 76 separates plug 74 from a piston 80 disposed in a guide 78. FIG. 3B of the example embodiment depicts the wax motor in an extended position that provides a load for a stroke length of piston 80. Heat applied to wax expansion material 70 melts wax expansion material 70 from a solid to a liquid form causing expansion of the wax expansion material 70 and a resulting force against plug 74 that moves piston 80 in guide 78. By interfacing piston 80 to a pressure adapter of a vapor chamber, the pressure within the vapor chamber adapts the saturation point of the vapor chamber at the temperature at which wax expansion material 70 transitions between liquid and solid states. In one embodiment, the melting temperature of wax expansion material 70 substantially matches a maximum temperature associated with a housing portion sot that the wax motor increases pressure within a vapor chamber as the vapor chamber reaches a maximum temperature so that thermal transfer efficiency of the vapor chamber is decreased. As an example of such a passive thermal transfer control, a wax motor may be integrated within a hinge that includes a vapor chamber to transfer thermal energy between housing portions. As the hinge reaches the wax melting point, the wax expands to increase pressure within the hinge vapor chamber and thus reduce thermal transfer. In alternative examples, heat may be applied at the wax to melt the wax with active control when a change in vapor chamber efficiency characteristics is desired.

Referring now to FIG. 4, a side cutaway view depicts a solenoid motor actuator that controls thermal transfer at an information handling system 10. In the example embodiment, a case 82 includes magnetic flux lines 84 and contains a coil winding around a plunger 88 that is biased by a return spring 90. A piston 92 extends from plunger 88 and has its position adjusted by current applied at an electrical connection 94. A controller, such as an embedded controller, actively manages pressure within a vapor chamber by applying current to electrical connections 94, such as with a GPIO or other interface. Piston 92 interfaces with a vapor chamber to adjust pressure by moving a pressure adjusting device within the vapor chamber.

Figure 5:
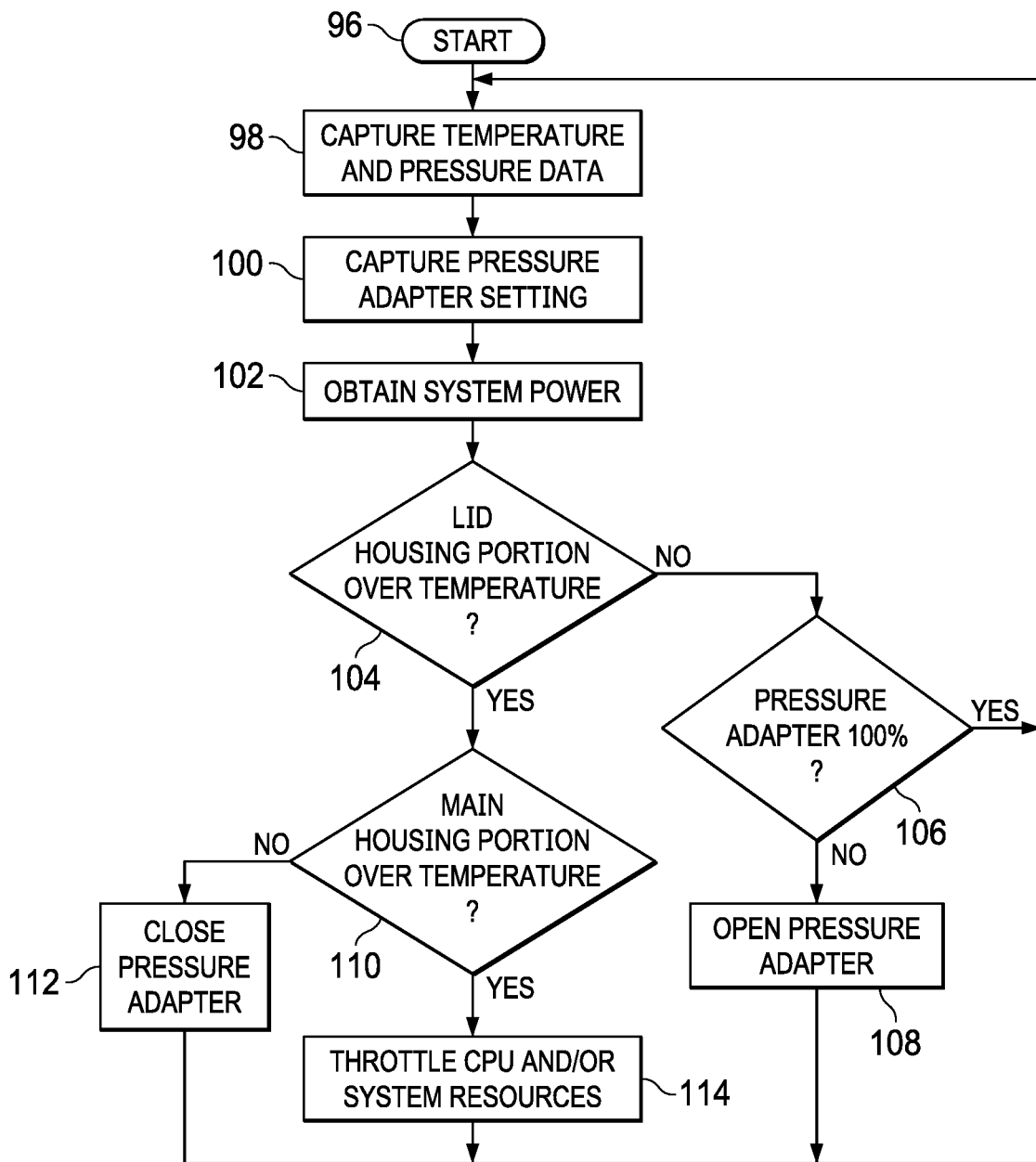
FIG. 5 depicts a flow diagram of a process for managing thermal energy transfer between separate housing portions.

Referring now to FIG. 5, a flow diagram depicts a process for managing thermal energy transfer between separate housing portions. For example, a pressure adapter within a vapor chamber of a lid housing portion manages the efficiency of the vapor chamber to spread thermal energy at the lid housing portion, such as to control the surface temperature of the lid housing portion. The process starts at step 96 and proceeds to step 98 to capture temperature and pressure data associated with thermal management at an information handling system. For example, an embedded controller or operating system module collects temperatures from temperature sensors to monitor thermal conditions across the information handling system housing portions, and determines the pressure and temperature of vapor chambers that have configurable thermal transfer settings. At step 100, pressure adapter settings are captured for the vapor chambers that have configurable thermal transfer settings, such as the position of pistons within the vapor chambers, the size of bladders within the vapor chambers, the temperature of fluid within vapor chambers, the amount of fluid within vapor chambers, etc. . . . At step 102, system power dissipation is captured to analyze thermal energy creation in the housing portions. For example, CPU clock speed and processing modes indicate CPU power draw, as do active applications and pending processing tasks. Other examples of thermal energy sources that may vary based on system operations include graphics processing, display settings and battery charging. Analysis of power used at the thermal energy sources provide an estimate of the amount of thermal energy that the information handling system has to reject. Comparison of the thermal state of the information handling system as determined by the sensed temperatures and configurable vapor chamber settings with the thermal energy generated by information handling system operations provides an estimate for the system's ability to absorb additional thermal energy without exceeding thermal constraints, such as CPU, display, battery or outer surface temperature thresholds. In various example embodiments, a thermal controller balances thermal constraints and operational power needs with a feedback look and control algorithm that controls available thermal dissipation tools, such as vapor chamber pressure and thermal conduit interfaces.

In the example embodiment, the process continues to step 104 to determine if the information handling system lid housing portion outer surface has an over temperature condition. In alternative embodiments, other information handling system components may be monitored, such as a main housing outer surface temperature or a thermal spreader temperature, such as vapor chamber. In one alternative embodiment, multiple temperatures are monitored to predict that an over temperature will occur. If no over temperature is found at step 104, the process continues to step 106 to determine if the pressure adapter in the vapor chamber is at 100%, meaning that vapor chamber thermal transfer efficiency is fully available. If not, the process continues to step 108 to open the pressure adapter so that additional thermal energy is transferred across the lid housing portion and then to step 98 to continue monitoring of thermal conditions. If at step 106 the vapor chamber is set at full efficiency, the process returns to step 98 to continue monitoring thermal conditions.

If at step 104 a lid housing portion over temperature is determined, the process continues to step 110 to determine if a main housing over temperature exists. If the main housing portion does not have an over temperature, the process continues to step 112 to close the pressure adapter so that thermal energy transfer efficiency to the lid housing portion is decreased, and then the process returns to step 98 to continue thermal management monitoring. Decreasing the thermal efficiency transfer at the lid housing portion reduces the temperature of the lid housing portion with a corresponding reduction in thermal transfer from the main housing portion to the lid housing portion. The reduction in thermal transfer from the main housing portion tends to increase the temperature of the main housing portion. If at step 110 the main housing portion has an over temperature, the process continues to step 114 to throttle the system CPU and/or other system resources that generate thermal energy. The process then continues to step 98 to continue monitoring thermal conditions. In summary in the example embodiment, if thermal rejection from both the lid and main housing portions falls behind power dissipation, reducing power dissipation by throttling the CPU reduces thermal energy creation to reduce system temperatures. Once temperatures are reduced at the housing portions, changes to the pressure adapter can once again adjust thermal transfer between the housing portions.

Figure 6:
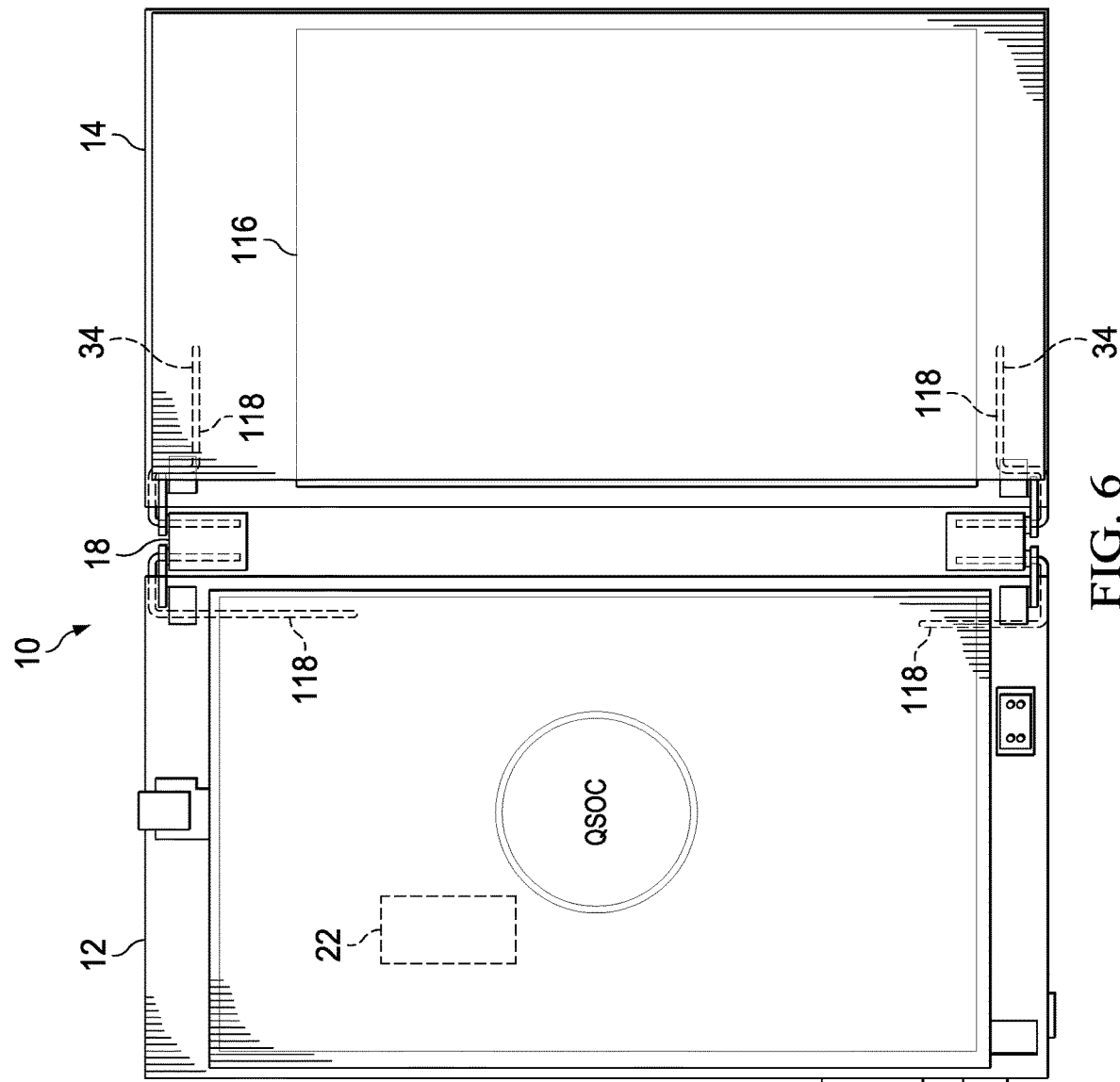
FIG. 6 depicts a top view of an information handling system configured with thermal energy dissipation devices that spread thermal energy across separate housing portions.

Referring now to FIG. 6, a top view depicts an information handling system 10 configured with thermal energy dissipation devices that spread thermal energy across separate housing portions. In the example embodiment, a main housing portion 12 includes a system on chip CPU 22 thermally coupled to a vapor chamber 34 that accepts and dissipates thermal energy labeled $Q_{SOC}$. In order to increase the amount of thermal energy that CPU 22 can release within main housing portion 12 without exceeding a threshold temperature, thermal conduits 118 thermally interface with vapor chamber 34 to act as a thermal conduit of thermal energy from main housing portion 12 through hinges 18 to lid housing portion 14. Lid housing portion 14 includes vapor chambers 34 on opposing sides of lid housing portion 14 and a heat spreader 116 disposed between vapor chambers 34 that dissipates heat transferred from main housing portion 12. Heat spreader 116 is, for example a sheet of graphite that couples to each vapor chamber 34 within lid housing portion 14. In alternative embodiments, other structures may spread thermal energy, such as a battery that power information handling system 10 or the material of lid housing portion 14. Spreading thermal energy across main and lid housing portions 12 and 14 provide a large surface area for rejection of the thermal energy to the external environment while also maintaining a reduced temperature for a given thermal state.

In the example embodiment, interfacing multiple thermal energy dissipation devices provides control of temperature states across information handling system 10. Starting with lid housing portion 14, control of the efficiency with which vapor chambers 34 dissipate thermal energy at opposing sides of housing portion 14, such as by actuation of a pressure adapter within each vapor chamber 34, controls temperatures at opposing ends of lid housing portion 14. If, for example, one side becomes warmer than the other, adjustments of pressure within each vapor chamber 34 controls dissipation of thermal energy to achieve a more uniform temperature at lid housing portion 14's outer surface. Similarly, if a battery or display temperature reaches a limit, increasing pressure within vapor chambers 34 reduces thermal energy dissipation towards the center of lid housing portion 14 to maintain temperature operating constraints for the battery and/or display. Thermal conduits 118 provide another thermal energy dissipation management tool to control temperatures across information handling system 10. For example, thermal conduits 118 may integrate a vapor chamber or other fluid thermal energy transfer mechanism as described below that impacts the amount of thermal energy transferred between housing portions 12 and 14. For instance, increased pressure within a vapor chamber thermal conduit 118 reduces thermal energy transfer along the length of thermal conduit 118. Similarly, adjustments of saturation points in adjacent vapor chambers impacts how efficiently thermal energy transfers from one vapor chamber to an adjacent vapor chamber. In an alternative embodiment that pumps heated fluid in liquid form across housing portions, thermal management may be enforced by controlling the pump speed.

Hinges 18 and their thermal interface with thermal conduits 118 provide another control location for transfer of thermal energy between housing portions 12 and 14. For example, rather than increasing pressure within vapor chamber 34 to decrease transfer of thermal energy out of main housing portion 12, increasing the thermal resistance at hinges 18 reduces thermal transfer to lid housing portion 14. In the example embodiment, each hinge 18 is a two axis hinge that supports 360 degrees of rotation of the housing portions relative to each other. Each thermal conduit passes along a rotational axis of a hinge 18 to pass thermal energy through a thermally conductive structure defined by the body of hinge 18. For example, as described in greater detail below, thermally conductive structures integrated in hinge conduct thermal energy between thermal conduits associated with each axis. As another example, fluid integrated in each hinge 18 transfers thermal energy between thermal conduits 118 with convection that, in some embodiments, includes phase change between liquid and gas states having saturation point management with an integrated pressure actuators, such as a wax motor.

Figure 7:
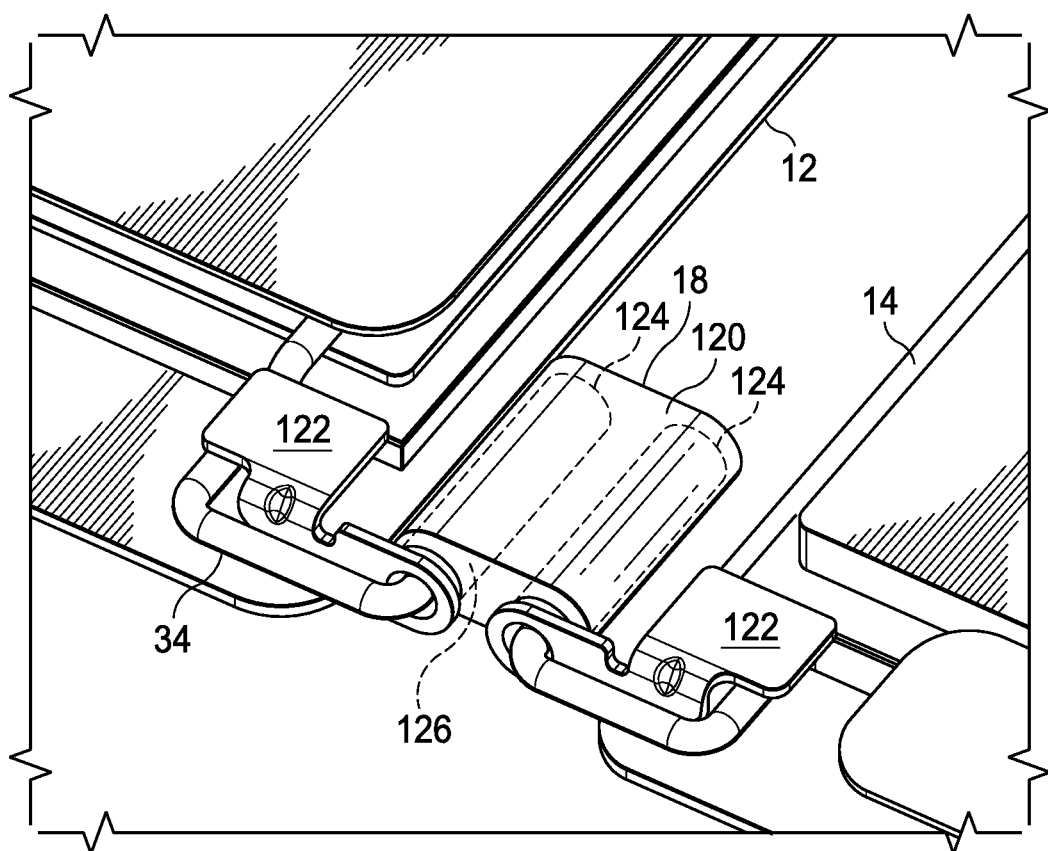
FIG. 7 depicts a side perspective view of a hinge rotationally coupling main and lid housing portions through a thermally conductive hinge body.

Referring now to FIG. 7, a side perspective view depicts a hinge 18 rotationally coupling main and lid housing portions 12 and 14 through a thermally conductive hinge body. In the example embodiment, a hinge bracket 122 couples hinge 18 to each housing portion 12 and 14 and to hinge body 120 so that rotational forces are managed separately from thermal transfer. As set forth below, rotation about the coupling of bracket 122 to hinge body 120 may be managed with gears or other synchronization devices not shown in FIG. 7. In the example embodiment, a thermal interface between hinge 18 and each housing portion 12 and 14 is provided with a vapor chamber 34, although in alternative embodiments alternative types of thermal conduits may be used, such as heat pipes, graphite cables and liquid pipes as described herein. In the example embodiment, each vapor chamber 34 is held in a secure manner relative to its associated housing and hinge axis so that forces associated with rotation of the housing portions are translated through brackets 122 with minimal force applied to vapor chambers 34. For example, hinge body 120 defines two separate openings that have a thermally conductive material between them. A conductive barrel 124 inserts into each of the openings to accept thermal energy from a vapor chamber 34 and to transfer the thermal energy across the thermally conductive material of hinge body 120 to a conductive barrel 124 inserted in the other opening. Each vapor chamber 34 inserts into a conductive barrel 124 of a separate opening of hinge body 120 to transfer thermal energy Q across hinge body 120 and into the other housing portion. Thermal grease 126 is pressed into the interior of each conductive barrel 124 to encourage heat transfer between the inserted vapor chamber 34 and conductive barrel 124 and reduce friction associated with hinge body 120 movement about each axis. In various embodiments, conductive barrel 124 may be fixed relative to hinge body 120 or may rotate relative to hinge body 120 to further reduce transfer of any frictional forces to vapor chamber 34. In the example embodiment, vapor chamber 34 is a three dimensional vapor chamber that transfers thermal energy as a heat pipe from main housing portion 12 to hinge 18. Heat in main housing portion 12 transitions a fluid to gaseous form so that the gas expands to the portion of vapor chamber 34 that is located in hinge 18. Within hinge body 120, the fluid transitions from vapor to liquid form to release heat and wicks back to the portion of vapor chamber 34 in main housing portion 12. Heat from hinge 18 passes through another vapor chamber 34 or other heat pipe structure to lid housing portion 14. For example a vapor chamber 34 extending from hinge 18 to lid housing portion 14 may be brazed and/or soldered to a flat plate or vapor chamber disposed in lid housing portion 14. Alternatively, a three dimensional vapor chamber may extend from hinge 18 to lid housing portion 14 so that fluid transfers as a vapor in hinge 18 to release heat in a transition to a liquid in lid housing portion 14.

Figure 8:
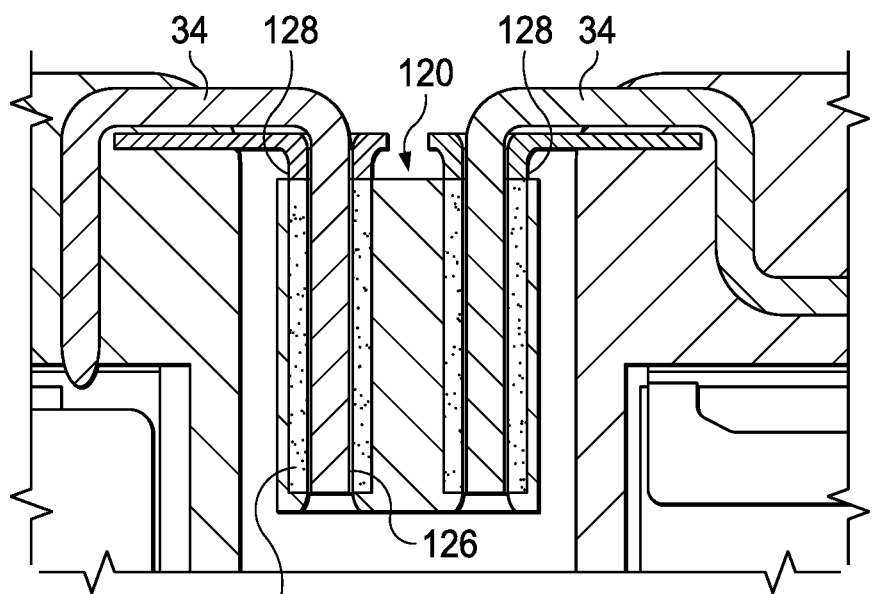
FIG. 8 depicts a cutaway view of a hinge 18 having a thermal conduit inserted into a conductive barrel to conduct thermal energy across the hinge body.

Referring now to FIG. 8, a cutaway view depicts a hinge 18 having a thermal conduit 34 inserted into a conductive barrel 124 to conduct heat across the hinge body 120. Conductive barrel 124 is, for example, a brass insert that engages with hinge body 120 and has low thermal resistance. Thermal grease 126 inserted between the thermal conduit, which in the example is a vapor chamber, and conductive barrel 124 encourages thermal energy transfer while supporting rotation of hinge body 120 and conductive barrel 124 about vapor chamber 34. A bushing 128 on each end of conductive barrel 124 seals thermal grease 126 in place with the level of the seal depending upon the type of thermal grease selected. The vapor chamber 34 may have fins that extend into the thermal grease 126 within the hinge body 120, the fins interacting with the thermal grease 126 during rotation of the main housing portion 12 and lid housing portion 14 relative to each other. Thermal energy transfers across a conductive material of hinge body 120 between the conductive barrels 124, while physical forces applied against the thermal conduit are minimized through a separate rotational coupling mechanism, such as brackets 122.

Figure 9:
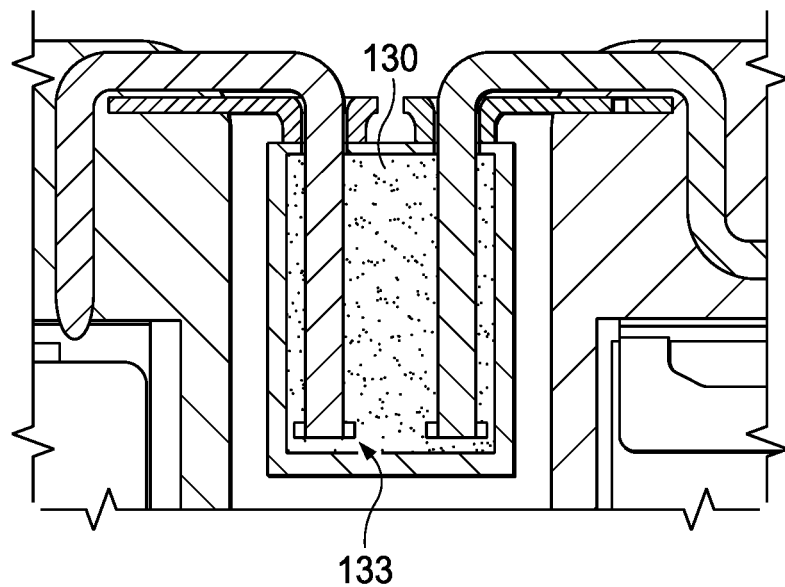
FIG. 9 depicts a cutaway view of a hinge having a fluid filled body that transfers thermal energy between rotationally coupled housing portions.
Figure 10:
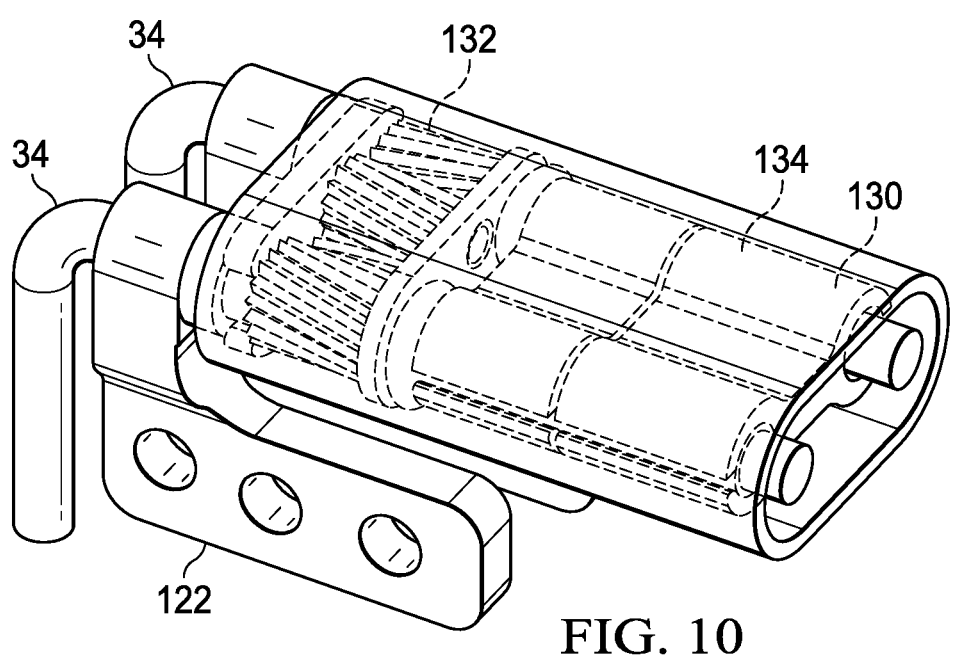
FIG. 10 depicts a side perspective view of a hinge having thermal conduits integrated through synchronized axes to exchange thermal energy at the hinge body.

Referring now to FIG. 9, a cutaway view depicts a hinge 18 having a fluid filled body 120 that transfers thermal energy between rotationally coupled housing portions 12 and 14. In the example embodiment, thermal energy transferred from one housing portion through a thermal conduit 118 is transferred through a fluid integrated in hinge body 120 to a thermal conduit 118 associated with the other housing portion. The fluid integrated in hinge body 120 may be water or any other liquid and/or gas that has low thermal resistance. In the example embodiment, friction fins 133 extend from the outer surface of each thermal conduit 118 to help convective transfer of thermal energy by moving within the liquid 130, such as during rotation of housing portions relative to each other. In addition to adding convective motion to liquid 130, friction fins 133 provide dampening against rotational motion, such as when a lid housing portion closes next to a main housing portion. In such an example embodiment, thermal conduit 118 may have a more resilient construction to withstand rotational forces, such as a copper wire or tube, however, the rotational forces are primarily managed with a hinge structure, such as brackets 122.

Figure 11:
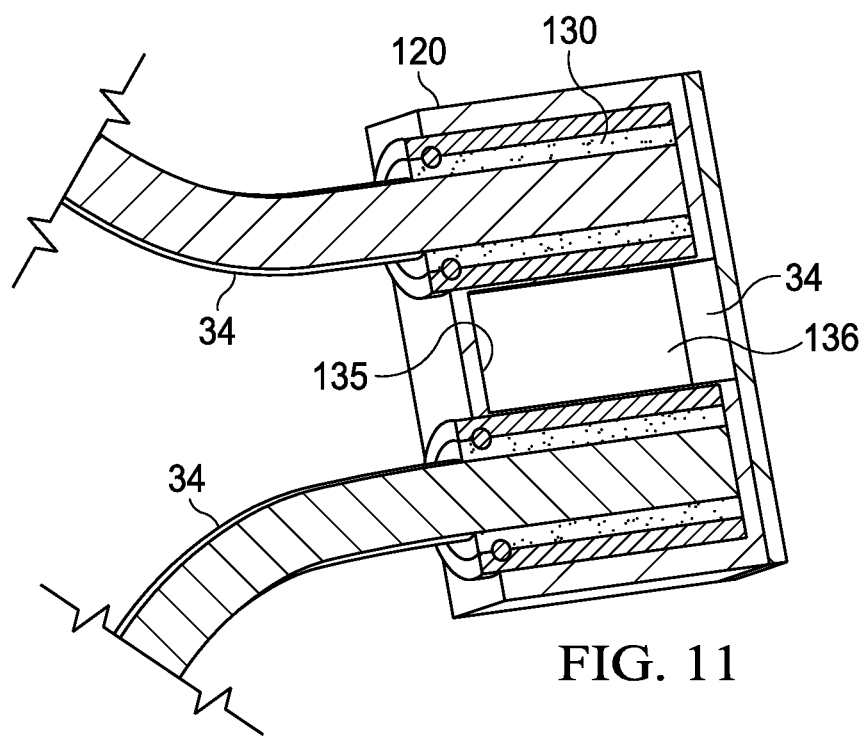
FIG. 11 depicts a side cutaway view of a hinge integrating a vapor chamber that transfers thermal energy between thermal conduits coupled to the hinge and rotationally coupled housing portions.

Referring now to FIG. 11, a side cutaway view depicts a hinge 18 integrating a vapor chamber 34 that transfers thermal energy between thermal conduits coupled to the hinge and rotationally coupled housing portions. In the example embodiment, hinge body 120 integrates a vapor chamber 34 that includes a sintered powder wicking structure 135 on interior surfaces to improve evaporation, condensation and liquid transport of a fluid 130 disposed in the vapor chamber 34 located between the thermal conduits. A wax material 136 adjacent fluid 130 melts at a temperature threshold associated with a thermal limit for transfer of thermal energy across hinge 18 to compress fluid 130 and increase the saturation point, thus resulting in less efficient thermal transfer through hinge 18. At temperatures below the threshold, thermal energy passes through fluid 130 by transitioning fluid 130 between liquid and gaseous states. At the threshold, melting of wax 136 increases the saturation point so that thermal energy is transferred across hinge 18 less efficiently. In alternative embodiments, alternative types of control, such as active control managed by a microcontroller or other processor, may be used to adjust transfer of thermal energy across hinge 18.

Referring now to FIG. 11, a side cutaway view depicts a hinge 18 integrating a vapor chamber 34 that transfers thermal energy between thermal conduits coupled to the hinge and rotationally coupled housing portions. In the example embodiment, hinge body 120 integrates a vapor chamber 34 that includes a sintered powder wicking structure 134 on interior surfaces to improve evaporation, condensation and liquid transport of a fluid 130 disposed in the vapor chamber 34 located between the thermal conduits. A wax material 136 adjacent fluid 130 melts at a temperature threshold associated with a thermal limit for transfer of thermal energy across hinge 18 to compress fluid 130 and increase the saturation point, thus resulting in less efficient thermal transfer through hinge 18. At temperatures below the threshold, thermal energy passes through fluid 130 by transitioning fluid 130 between liquid and gaseous states. At the threshold, melting of wax 136 increases the saturation point so that thermal energy is transferred across hinge 18 less efficiently. In alternative embodiments, alternative types of control, such as active control managed by a microcontroller or other processor, may be used to adjust transfer of thermal energy across hinge 18.

Figure 12:
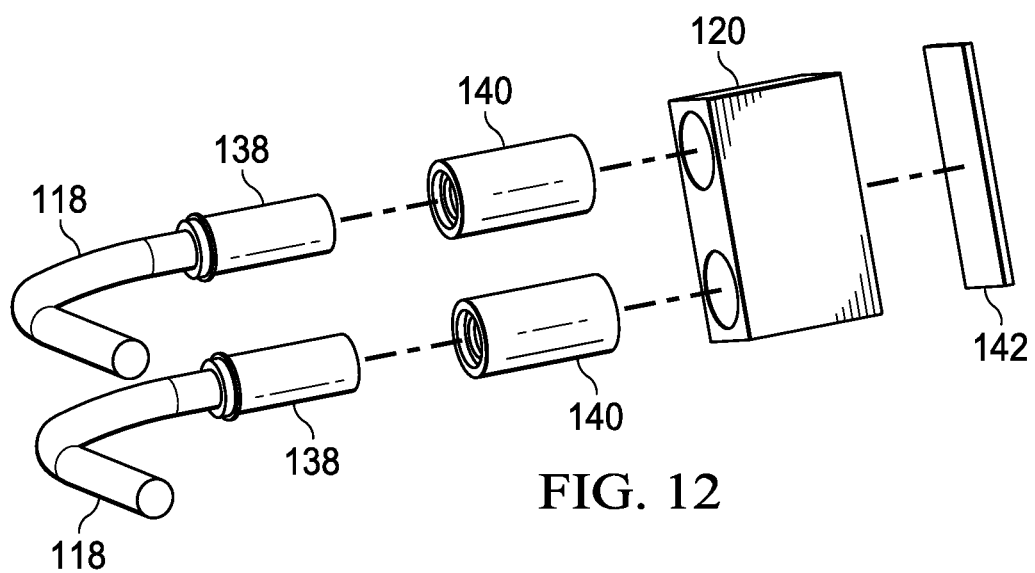
FIG. 12 depicts an exploded view of a hinge having thermal transfer performed with an integrated vapor chamber.

Referring now to FIG. 12, an exploded view depicts a hinge 18 having thermal transfer performed with an integrated vapor chamber 34. In the example embodiment, thermal conduits 118 transfer thermal energy with a thermally conductive material, such as copper or graphite heat pipe or a vapor chamber, which thermally couples to an insert 138, such as a brass cylinder. For example, each thermal conduit interfaces with a housing portion to conduct thermal energy to and/or from the housing portion. Insert 138 rotationally couples with a sleeve 140 to support rotational movement of thermal conduits 118 as housing portions rotate relative to each other. Thermal energy transfers between insert 138 and sleeve 140 with the aid of thermal grease. Sleeves 140 fit into hinge body 120 to provide a thermal interface with a vapor chamber formed within hinge body 120. A backing plate 142 seals the vapor chamber within hinge body 120. The insert and sleeve construction of hinge 120 reduces manufacture complexity by allowing a vapor chamber within hinge body 120 to be built and pressurized separate from the assembly of hinge 18. At manufacture of an information handling system, thermal conduits 118 of various types fit into a common hinge by interacting through a common insert 138 and sleeve 140.

Figure 13:
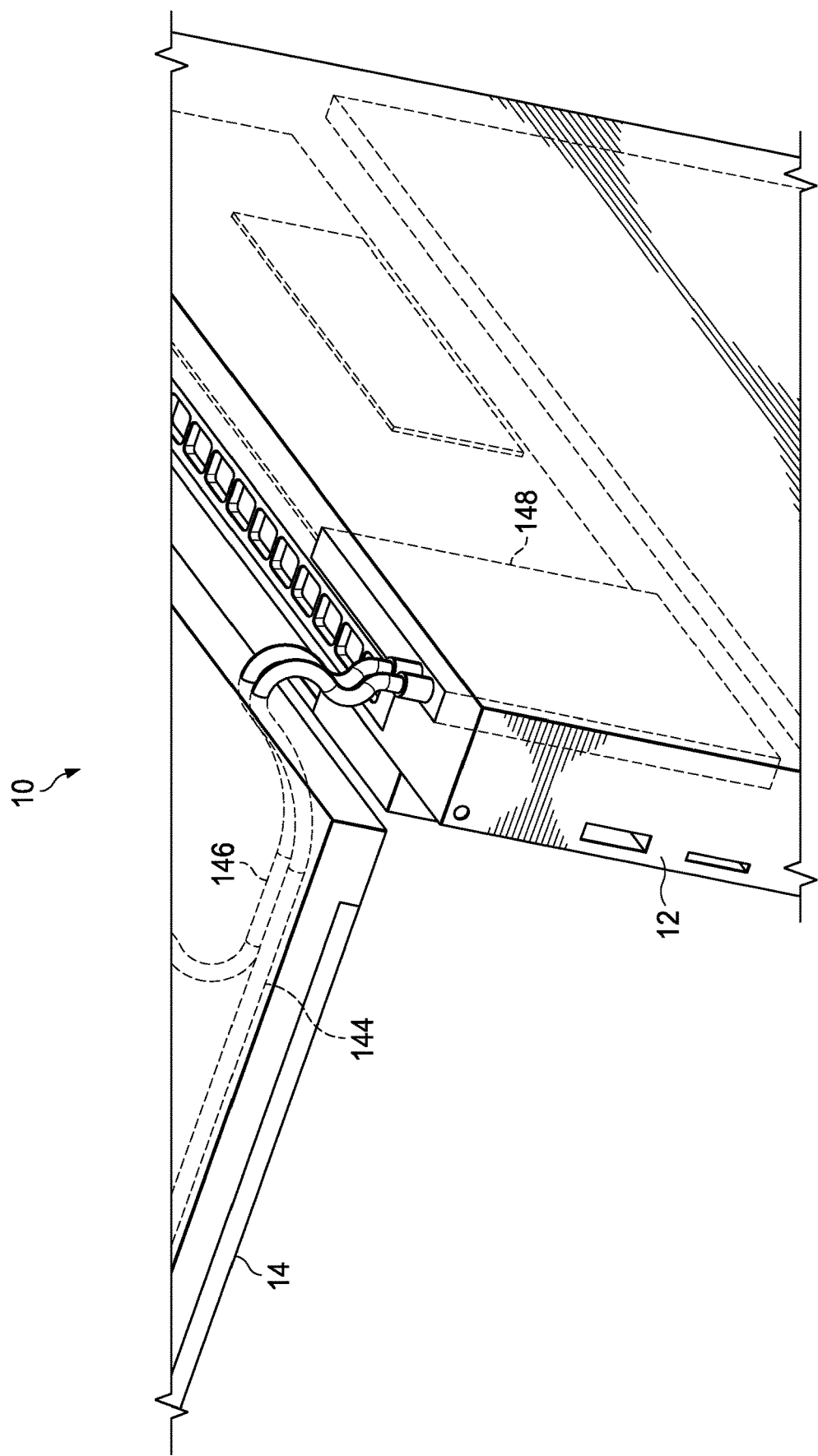
FIG. 13 depicts a bottom perspective cutaway view of an information handling system having liquid fluid thermal energy transfer through a dual axis hinge.

Referring now to FIG. 13, a bottom perspective cutaway view depicts an information handling system 10 having liquid fluid thermal energy transfer through a dual axis hinge. In the example embodiment, a fluid exhaust line 144 carries liquid from a main housing portion 12 to a lid housing portion 14, and a fluid return line 146 carries liquid from lid housing portion 14 to main housing portion 12. The path of fluid exhaust line 144 and fluid return line 146 traverses the location of each hinge axis with the hinge removed from the view for clarity. Liquid is heated at a cold plate 148 that thermally couples to a heat source of main housing portion 12, such as a CPU. A pump integrated with cold plate 148 pumps heated fluid into fluid exhaust line 144 and accepts the liquid back through fluid return line 146. A thermal controller or other processing device executes logic that manages thermal energy transfer, such as to keep temperatures of main housing portion 12 and lid housing 14 within desired parameters as describe above. In various embodiments, cold plate 148 may couple directly to a heat source, such as a CPU, or may couple indirectly to a heat source, such as to a heat sink or vapor chamber that couples directly to a CPU. A pump to transfer heat liquid may integrate in cold plate 148 or may be installed separately to interface with cold plate 148. In the example embodiment, both fluid exhaust line 144 and fluid return line 146 pass along the same path between main housing portion 12 and lid housing portion 14. In alternative embodiments, fluid exhaust line 144 and fluid return line 146 may pass through separate hinges, such as at opposing sides of information handling system 10. In one alternative embodiment, liquid may be used to directly transport thermal energy to a hinge, which then passes the thermal energy to an opposing housing portion through other thermal transfer structures, such as those describe above. Various combinations of the thermal transfer structures described herein may be used to transfer thermal energy within and between housing portions.

Figure 14:
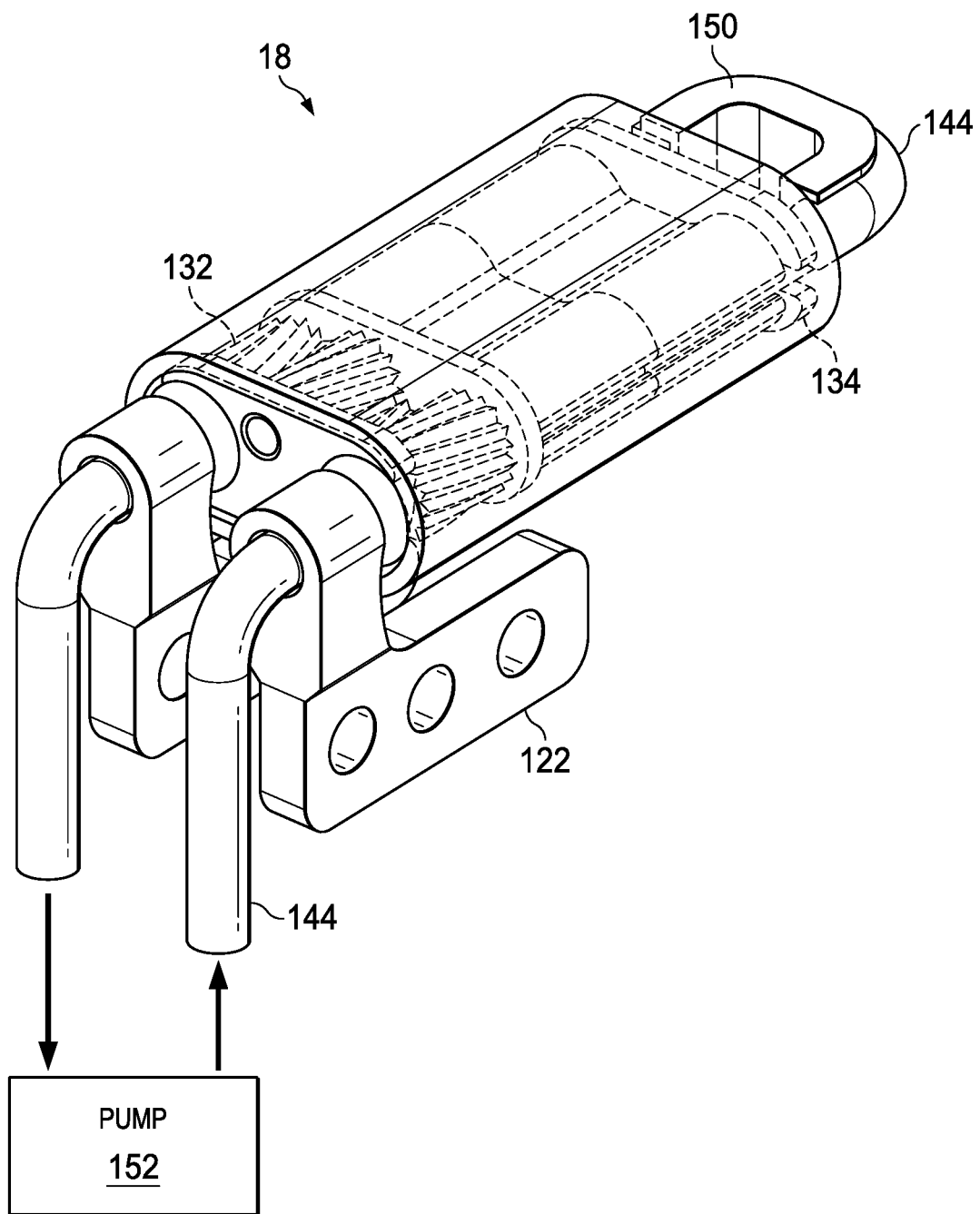
FIG. 14 depicts a side perspective view of a hinge having liquid pumped through each axis to support thermal transfer between information handling system housing portions.

Referring now to FIG. 14, a side perspective view depicts a hinge 18 having liquid pumped through each axis to support thermal transfer between information handling system housing portions. In the example embodiment, a pump 152, such as a pump integrated in a cold plate 148, pumps liquid from a first housing portion towards hinge 18 through a fluid exhaust line 144. The fluid passes through the hinge 18 at a first axle to exit out at a second axle. Hinge 18 provides rotation about two axes with a bracket 122 at each axis coupling to an information handling system housing portion. Each bracket 122 couples to a gear mechanism 132 that translates rotation of the brackets in a synchronized manner. A friction element 134 engages the axles to regulate rotation of brackets 122 by generating friction that resists rotation. Fluid passes into the first axle, such as through a flexible fluid line that passes through a channel defined in the first axle, to exit at a guide 150 that directs the fluid line into the second axle. The fluid exhaust line proceeds through the second axle and out to the second information handling system housing portion. In the example embodiment, fluid flows in one direction only so that return of fluid to pump 152 is supported with a second hinge that integrates a fluid line and flows fluid in an opposite direction. In an alternative embodiment, two separate fluid lines may pass through hinge 18 to support fluid exhaust and return through a single hinge 18. In an alternative embodiment, the axles of hinge 18 may have a contiguous construction to support fluid flow and obviate the use a separate fluid line. Quick connects or other fluid tight coupling mechanisms may be used to couple fluid lines to hinge 18.

Figure 15:
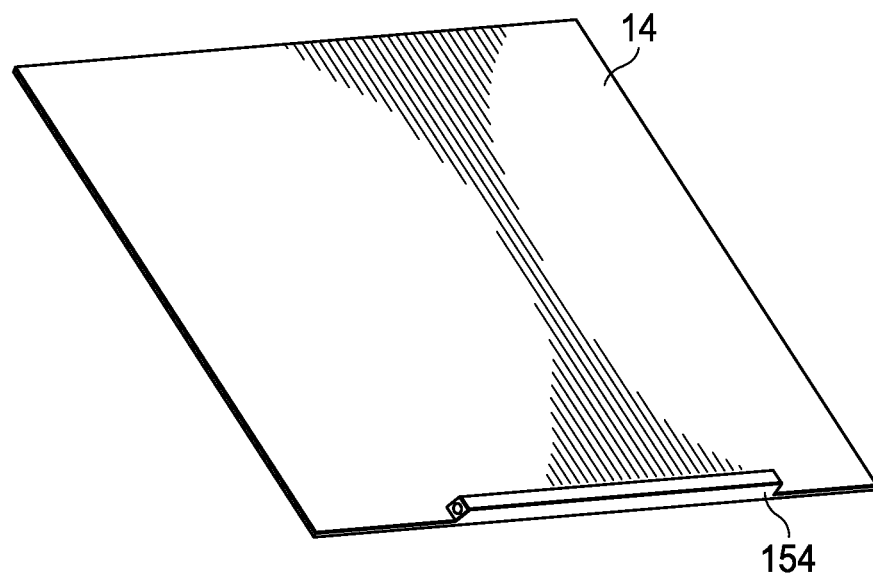
FIG. 15 depicts a side perspective view of an information handling system lid housing portion that integrates a vapor chamber to dissipate and reject thermal energy received from a main housing portion.

Referring now to FIG. 15, a side perspective view depicts an information handling system lid housing portion 14 that integrates a vapor chamber 34 to dissipate and reject thermal energy received from a main housing portion. Generally, convertible portable information handling systems that have rotationally coupled housing portions tend to have substantially the same surface area in each housing portion. With such a configuration, rejecting thermal energy from both housing portions effectively doubles the surface area from which thermal energy transfers to the external environment. Thus, by using the various systems, apparatuses and techniques described herein to transfer thermal energy between housing portions, greater power dissipation is supported from processing components, such as the CPU, while maintaining system temperatures within defined limitations. Protrusion 154 integrates at a base side of lid housing portion 14 near where hinges 18 couple so that thermal energy transferred from a main housing portion can dissipate across the surface of lid housing portion 14.

Figure 16:
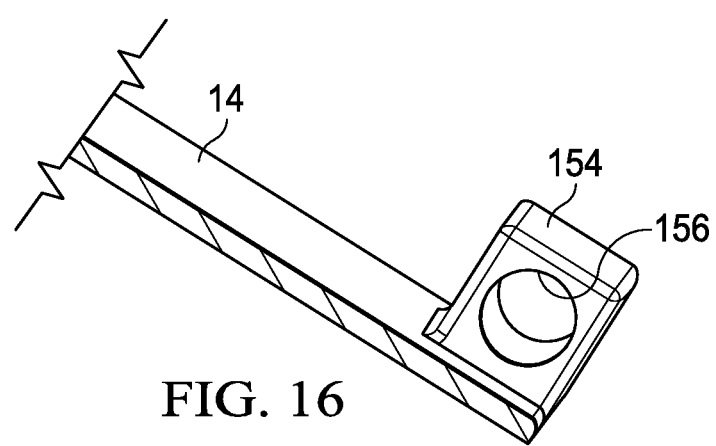
FIG. 16 depicts a side view of a protrusion and opening configured to accept a thermal conduit that transfers thermal energy from a main housing portion.

Referring now to FIG. 16, a side view depicts protrusion 154 and opening 156 configured to accept a thermal conduit that transfers thermal energy from a main housing portion. In the example embodiment, opening 156 defines a channel within protrusion 154 that accepts a thermal conduit 118 to provide enhanced thermal transfer about the channel surface. In one example embodiment, a thermal conduit inserts through opening 156 to rotate within the channel as lid housing portion 14 rotates relative to main housing portion 12, such as with thermal grease inserted between the thermal conduit and channel surface. In an alternative embodiment, the thermal conduit may fixedly couple within protrusion 154. Various thermal conduits may be fitted to insert in protrusion 154. For example, heated liquid may be pumped through a thermally conductive line that passes through opening 156. As another example, a vapor chamber may pass a gaseous fluid through protrusion 154 to condense to liquid and release thermal energy, after which the condensed liquid is returned to the main housing portion, such as encouraged by gravity feed. In another alternative embodiment, a thermal conductive cable may pass from the main housing portion to insert into opening 156. In yet another alternative embodiment, a hinge pin that rotationally couples the housing portions to each other by inserting into opening 156 also integrates a thermal conduit so that thermal energy passes through the actual hinge structure to the lid housing portion 14. For instance, a single axis hinge couples main and lid housing portions together to rotate about one axis, such as with a pin that inserts into a knuckle formed at the lid housing portion. A single axis hinge typically will not support 360 degrees of housing rotation, however, a convertible form factor that includes a tablet configuration is not included in some systems and provides more direct thermal transfer comparted to dual axis hinge assemblies. An example of such a system is depicted in FIG. 19 described below.

Figure 17:
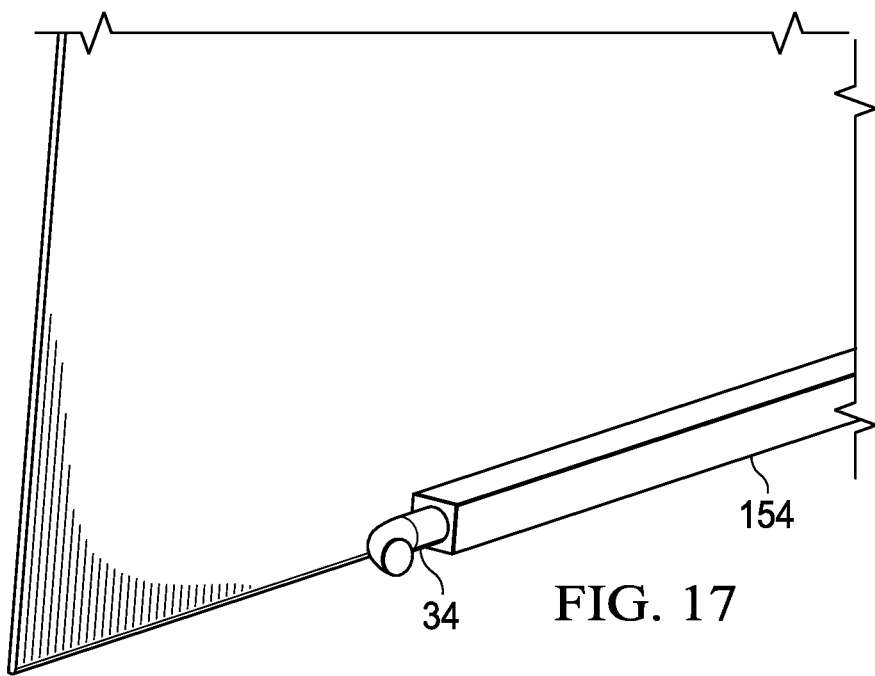
FIG. 17 depicts a side perspective view of a thermal conduit inserted into a protrusion to transfer thermal energy to a lid housing portion.

Referring now to FIG. 17, a side perspective view depicts a thermal conduit inserted into protrusion 154 to transfer thermal energy to lid housing portion 14. In the example embodiment, a vapor chamber 34 having a cylinder shape inserts into protrusion 154 to transfer thermal energy to lid housing portion 14. Fluid in a gaseous state passes from the main housing portion to condense and release thermal energy within protrusion 154. At condensation of the fluid within the opening 156 of protrusion 154, thermal energy is released and the fluid in the liquid state returns to the main housing portion to accept more thermal energy. As set forth above, other types of thermal conduits may be used to transfer thermal energy within protrusion 154.

Figure 18:
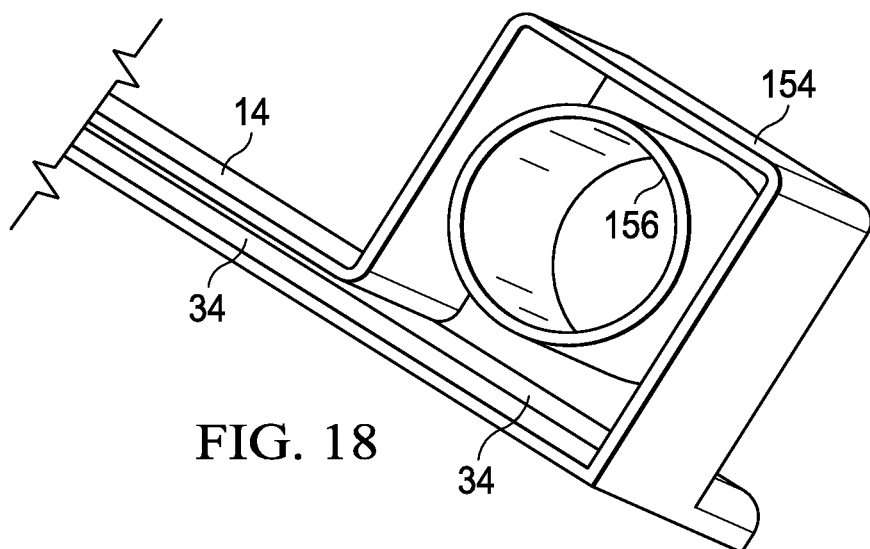
FIG. 18 depicts a side cutaway view of a vapor chamber integrated at a protrusion extending from a lid housing portion.

Referring now to FIG. 18, a side cutaway view of a vapor chamber 34 integrated at a protrusion 154 extending from a lid housing portion 14. A space defined between the inner walls of protrusion 154 and opening 156 forms a chamber that contains a fluid at a reduced pressure so that at a saturation point the fluid transitions from a liquid to a gaseous state. When lid housing portion 14 is rotated to a viewing position, heated gas rises, condenses and then returns to the base of protrusion 154 in a liquid state to accept additional thermal energy from a thermal conduit inserted in opening 156. In one example embodiment, vapor chamber within lid housing portion 14 extends upwards from protrusion 154 to a chamber of substantially the same area as lid housing portion 14. For example, lid housing portion 14 has an outer surface layer of stainless steel, titanium, copper, aluminum with a polymer coating or other materials used to form an information handling system outer surface. A secondary sheet of material is coupled on the inner side of the outer surface material to define a chamber between the outer surface layer and secondary sheet of material, such as with a half of a millimeter spacing across substantially all of the surface area of the lid housing portion. Within lid housing portion 14, vapor chamber 34 dissipates thermal energy across the surface area of lid housing portion 14 with reduced thermal resistance and vertical height.

Figure 19:
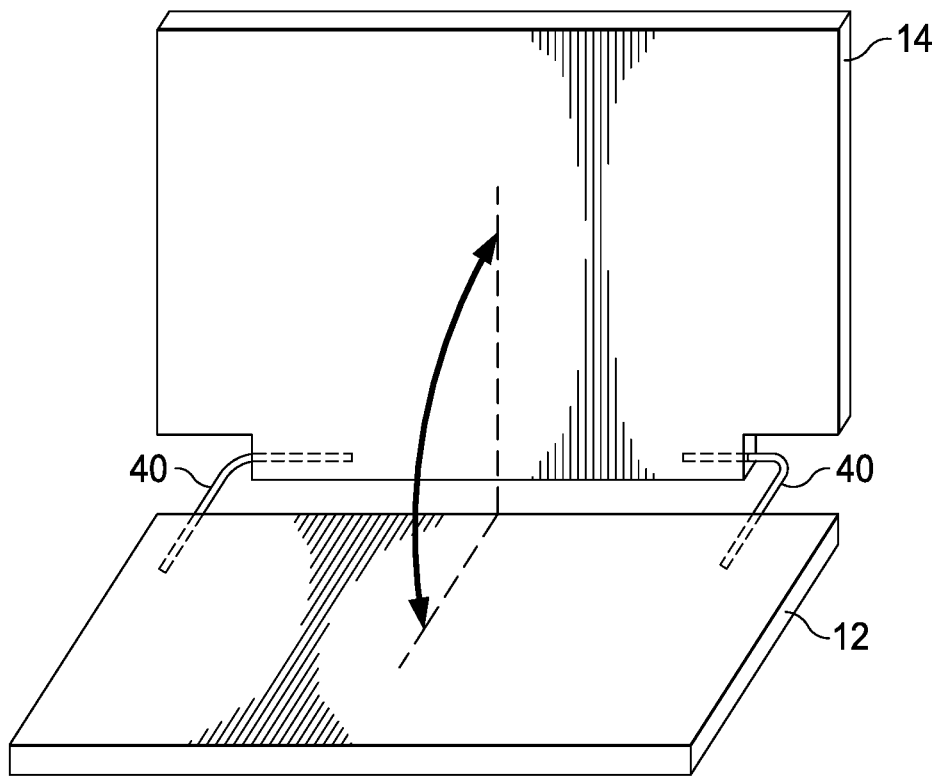
FIG. 19 depicts a portable information handling system in a clamshell open configuration that transfers thermal energy from main housing portion to a lid housing portion with a thermal conduit disposed through a single axis hinge.

Referring now to FIG. 19, a portable information handling system 10 in a clamshell open configuration transfers thermal energy from main housing portion 12 to a lid housing portion 14 with a thermal conduit 40 disposed through a single axis hinge 18. In the example embodiment, hinge 18 has a "three knuckle" configuration in which a protrusion 154 of lid housing portion 14 holds a pin anchored at opposing ends in main housing portion 12. Thermal conduit 40 proceeds from main housing portion 12 through hinge 18's central pin to transfer thermal energy to the inner surface of protrusion 154's opening 156. The example embodiment depicts thermal conduit 40 entering at one end of protrusion 154 and exiting at an opposing end, such as may be used to pump fluid in a liquid state through the length of protrusion 154. In alternative embodiments, thermal conduit 40 may enter protrusion 154 from one side only, such as with a cable that transfers thermal energy from one location of main housing portion 12.

Figure 20:
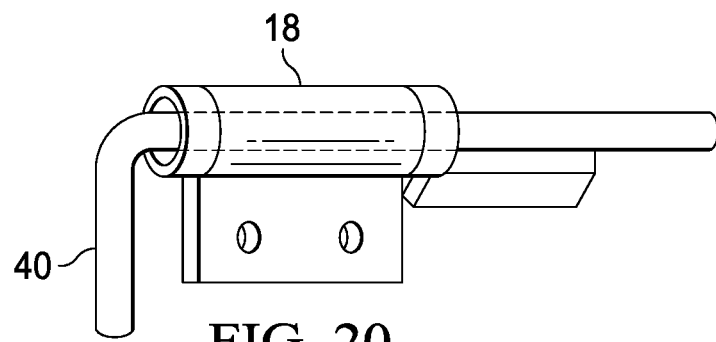
FIG. 20 depicts an example of a thermal conduit routed through outer and inner portions of a single axis hinge.
Figure 21:
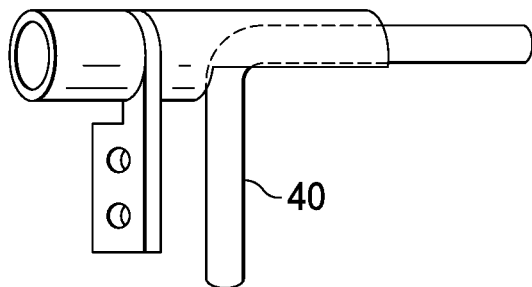
FIG. 21 depicts an alternative arrangement for passing a thermal conduit through a hinge 18 inner periphery mounting location.

Referring now to FIG. 20, an example embodiment depicts a thermal conduit routed through outer and inner portions of a single axis hinge 18. In the example embodiment, thermal conduit 40 is a cable that routes through a center portion of hinge 18 from the outer periphery of hinge 18's mounting location inwards towards protrusion 154. In one example embodiment, thermal conduit 40 routes with other interface wires, such as power and graphics communication cables through a channel defined in the pin of hinge 18 that proceeds through protrusion 154. For instance, thermal conduit 40 is a copper cable that is exposed in protrusion 154 to transfer thermal energy into lid housing portion 14. FIG. 21 depicts an alternative arrangement for passing thermal conduit 40 through hinge 18 at the inner periphery of hinge 18's mounting location, such as where less rotational movement is provided between the housing portions.

Figure 22:
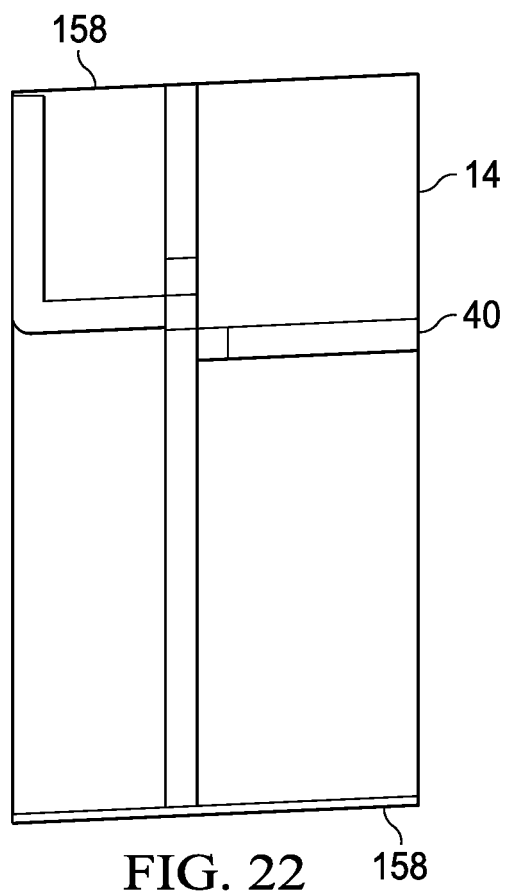
FIG. 22 depicts a lid housing portion integrating a thermal conduit that transfers thermal energy for dissipation across the lid housing portion's surface area.

Referring now to FIG. 22, a lid housing portion 14 is depicted integrating a thermal conduit 40 that transfers thermal energy for dissipation across the lid housing portion's surface area. In the example embodiment, thermal conduit 40 is graphite having one or more layers of graphene that efficiently transfers thermal energy in plane across the inner surface of lid housing portion 14 to integrated copper films 158 located at a distal perimeter of lid housing portion 14 relative to the entry of thermal conduit 40, such as at a hinge interface. For example, a pattern for thermal conduit 40 is cut from a sheet of graphene/graphite material and then fixed to lid housing portion 14's inner surface with adhesive. Graphite and/or graphene provides high in plane thermal conductivity of approximately 1600 W/mK with minimal cross plane thermal conductivity of approximately 3 W/mK. Thus, in the example embodiment, thermal energy is transported through thermal conduit 40 to copper film 158 in plane with minimal transfer out of plane from thermal conduit 40 directly to lid housing portion 14. Thermal conduit 40 couples in plane to copper film 158 so that thermal energy dissipates to the material of lid housing portion 14 primarily through the thermal interface provided by copper film 158 to lid housing portion 14. As is set forth below, thermal conduit 40 may be cut from one or more sheets of graphene and/or graphite so that a contiguous piece of material conducts thermal energy from main housing portion 12 through a hinge 18 to lid housing portion 14 for dissipation across the surface area of lid housing portion 14. Concentrations of thermal energy in lid housing portion 14 that might cause discomfort to an end user may be avoided by directing thermal energy to distributed locations of lid housing portion 14. For purposes of clarification, those of skill in the art will recognize that the common usage of the terms graphene and graphite sometimes strays from the strict scientific definitions. Graphene is one atomic layer of graphite having carbon atoms arranged in a hexagonal or honeycomb lattice. Graphite in natural or synthetic form is composed of multiple layers of graphene. Synthetic graphite is typically manufactured with a mixture of graphene and graphite to enhance desired properties, such as sheer strength and thermal conductivity. As used herein the terms graphite and graphene are not mutually exclusive and may include various naturally occurring and synthetic forms that achieve improved thermal conductivity.

Figure 23:
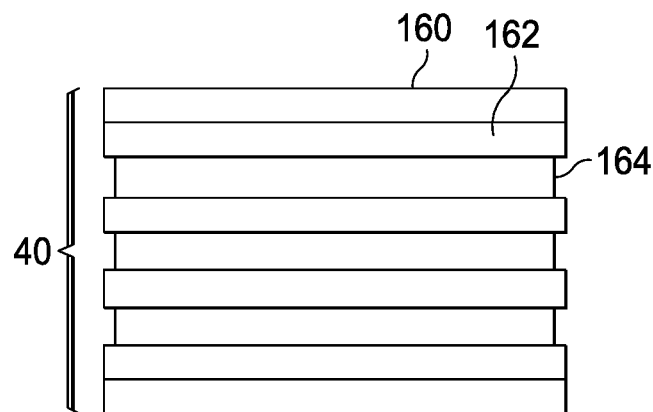
FIG. 23 depicts a side cutaway view of an example of a thermal conduit having plural layers of graphene.
Figure 24:
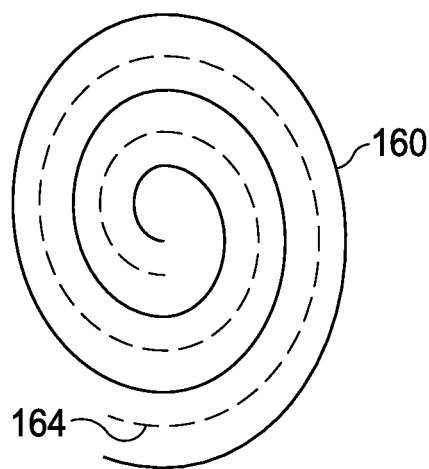
FIG. 24 depicts an alternative cable configuration in which multiple sheets of graphite are layered on top of each other and then rolled into a cable form having an outer protective layer.

Referring now to FIG. 23, a side cutaway view depicts an example of a graphite thermal conduit 40 having plural layers of graphene stacked within each graphite film 164. Each graphite film 164 includes plural graphene layers that transfer thermal energy in plane. Generally as used herein graphene refers to one layer of graphite. Increasing the thickness of a graphite film generally does not improve thermal conductance as thermal transfer for graphite film remains fairly consistent independent of film thickness. For example, a graphite film of 0.017 mm thickness provides approximately 1600 Wm-K of thermal conductivity while a similar film of 0.040 mm thickness provides approximately 1350 Wm-K of thermal conductivity. In order to enhance thermal energy transfer through a graphite/graphene thermal conduit 40, multiple separate layers of graphite are integrated into a cable form so that each separate layer of graphite separately transfers thermal energy. In the example embodiment, thermal conduit 40 has an outer PET protective film 160 that protects the graphite and couples through a single sided adhesive film 162 to an upper graphite film 164. Two additional graphite films 164 are layered between double sided adhesive films with a bottom PET protective film protecting the graphite. In the example embodiment of FIG. 23, graphite films 164 are cut into strips of a desired sized cable and, optionally, wrapped in insulation to limit undesired thermal energy escape at cable midpoints. FIG. 24 shows an optional cable configuration in which multiple sheets of graphite 164 are layered on top of each other and then rolled into a cable form having an outer protective layer 160. Each layer of graphite provides a separate thermally conductive pathway to transfer thermal energy with the rolled form factor stabilizing the graphite material in a reinforced manner.

Figure 25:
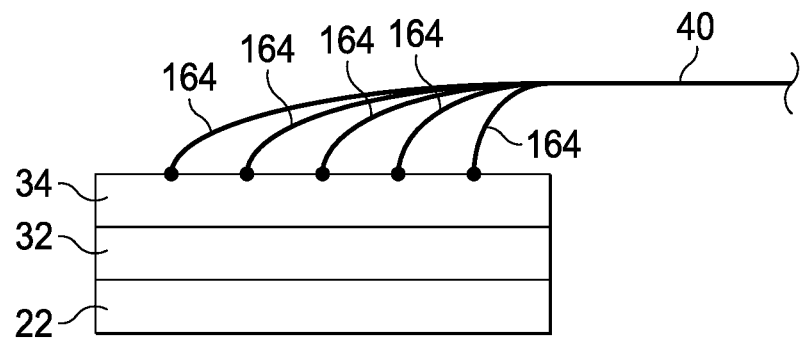
FIG. 25 depicts a multilayered graphite thermal conduit configured to transfer thermal energy from a vapor chamber with multiple thermal interface connection points dispersed across the surface of the vapor chamber.

Referring now to FIG. 25, a multilayered graphite thermal conduit 40 is depicted configured to transfer thermal energy from vapor chamber 34 with multiple thermal interface connection points dispersed across the surface of vapor chamber 34. In the example embodiment, CPU 22 generates thermal energy as a byproduct of execution, which dissipates power. A heat sink 32 couples to CPU 22 to capture thermal energy and reduce thermal spikes by providing a mass that absorbs thermal energy. Vapor chamber 34 couples to heat sink 32 and accepts thermal energy to aid in dissipation of the thermal energy across a greater surface area using phase transition of a fluid in a low pressure chamber having a desired saturation point. For instance, vapor chamber 34 may extend across a surface area of substantially the size of a main housing portion that contains CPU 22, where the greater surface area provides increased thermal energy rejection to the external environment. Thermal conduit 40 is a composite cable that includes plural graphite layers 164 that each transfer thermal energy from vapor chamber 34. In order to improve thermal transfer from vapor chamber 34, each individual graphite layer 164 independently couples to vapor chamber 34 to accept thermal energy from disparate locations across the surface area of vapor chamber 34. The individual layers of graphite 164 then integrate into one composite cable structure to pass through a hinge or other path to a target thermal device that accepts the thermal energy.

Figure 26:
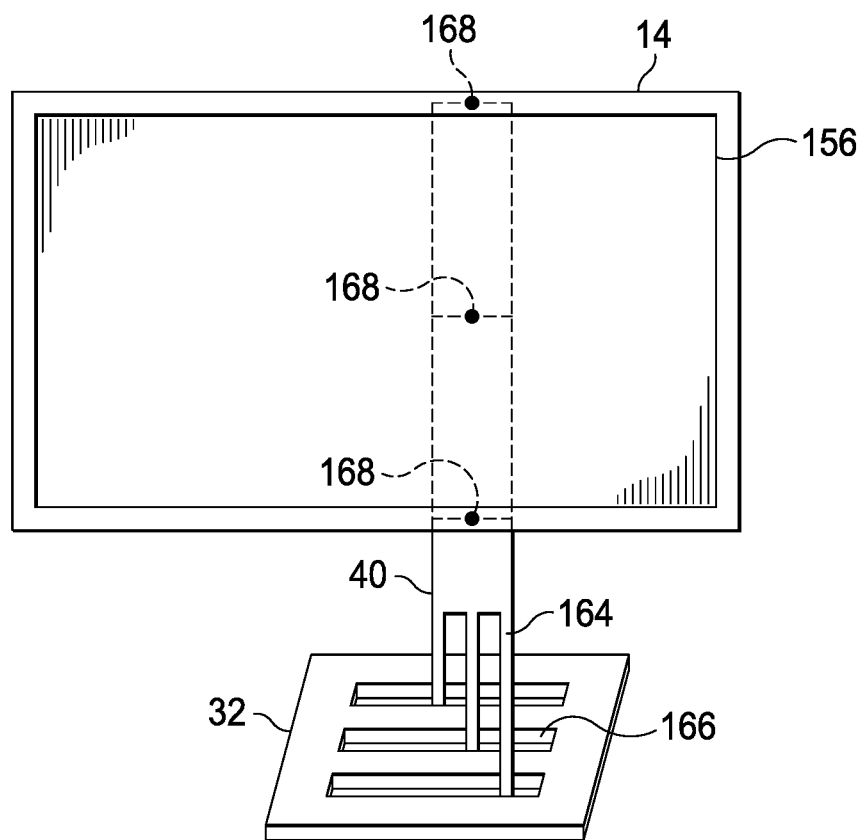
FIG. 26 depicts a multilayered graphite thermal conduit having each of plural layers thermally interfaced at dispersed locations of a heat sink and information handling system lid portion.

Referring now to FIG. 26, a multilayered graphite thermal conduit 40 is depicted having each of plural layers of graphite 164 thermally interfaced at dispersed locations of a heat sink 32 and information handling system lid portion 14. In the example embodiment, heat sink 32 includes plural cooling fins that extend upward to increase thermal rejection through increased surface area exposed to air. Thermal conduit 40 includes three graphite layers combined in a composite cable and having each graphite layer 164 independently terminating at a separate cooling fin 166. The composite thermal conduit passes as a contiguous piece to a lid housing portion 14 that accepts thermal energy from heat sink 32. A vertically oriented lid housing portion, such as in the clamshell open configuration, offers a large surface area exposed to an external environment that encourages rejected thermal energy to rise away from the information handling system. In the example embodiment, a copper film 156 is located at the perimeter of lid housing portion 14 and integrated with the lid housing portion material. Thermal conduit 40 couples to lid housing portion 14 at three contact points 168 with each graphite layer 164 coupled to a different contact point. Thermal energy that interfaces with copper film 156 spreads through the perimeter of lid housing portion 14 and into the material of lid housing portion 14. A direct thermal coupling of graphite layer 164 to lid housing portion 14 may provide a less efficient thermal transfer at a central location that tends to even the temperature across lid housing portion 14. In one alternative embodiment, copper film 156 or other thermal spreaders, such as graphite and/or aluminum, may extend across substantially all of the inner surface area of lid housing portion 14 to further enhance thermal dissipation.

Figure 27:
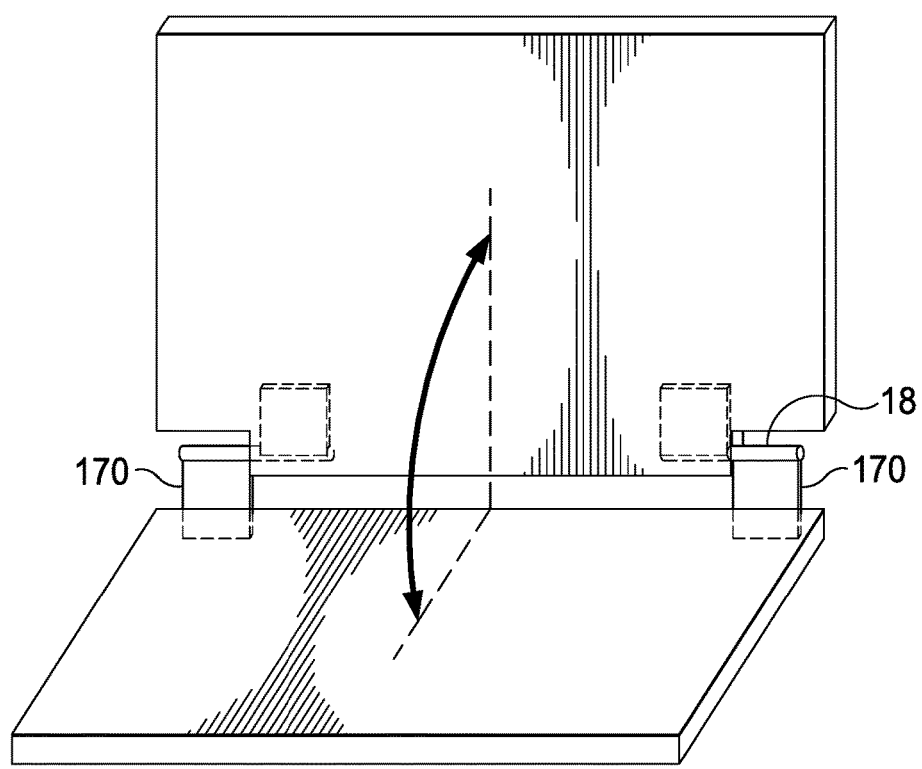
FIG. 27 depicts an information handling system in a clamshell open configuration having a layered graphite thermal spreader cut and folded to interface housing portions in a torsion spring configuration.

Referring now to FIG. 27, an information handling system 10 in a clamshell open configuration depicts a layered graphite thermal spreader 170 cut and folded to interface housing portions 12 and 14 in a torsion spring configuration. Graphite thermal spreader 170 has a first extension that thermally couples with lid housing portion 14 and a second extension that thermally couples with main housing portion 12. A central portion rolls around a hinge shaft or pin to fit in a seamless manner between the housing portions so that thermal energy is transferred across a contiguous piece of graphite. In the example embodiment, the extensions offset from the central portion on opposite sides of the central portion define the opposing ends of a torsion spring that tightens and loosens as the housing portions rotate relative to each other. Graphite thermal spreader 170 has the spring configuration in an opposite orientation at each hinge 18 so that both spring configurations tighten as the housing portions rotate to a closed position and loosen as the information rotates from the closed to an open position. In one embodiment, the torsion spring configuration wraps at a worst case angle so that during rotation the material unwinds or loosens. In an alternative embodiment, the torsion spring configuration attaches to a non-rotating hinge shaft with slack added between the shaft and connection to thermal spreaders in the housing portions. The torsion spring configuration provides a smallest path between thermal spreaders with a single rotation about the hinge shaft or pin.

Figure 28:
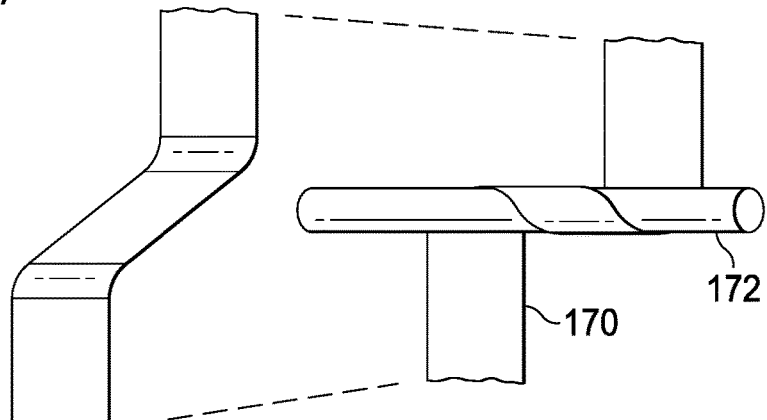
FIG. 28 depicts a graphite sheet cut to wrap around a hinge shaft in a torsion spring configuration.

FIG. 28 depicts a graphite sheet cut to wrap around a hinge shaft 172 in a torsion spring configuration of graphite thermal spreader 170. In the example embodiment, opposing L shaped pieces cut from a single graphite sheet provide a contiguous graphite form that wraps once around a hinge pin 172 as shown. For instance, as the center portion of graphite thermal spreader 170 wraps around hinge pin 172, the opposing extensions support the torsion spring configuration without any overlap of the extensions. In one alternative embodiment, multiple layers of graphite sheets are stacked as describe above so that the torsion spring configuration transfers thermal energy through the multiple layers of graphite.

Figure 29:
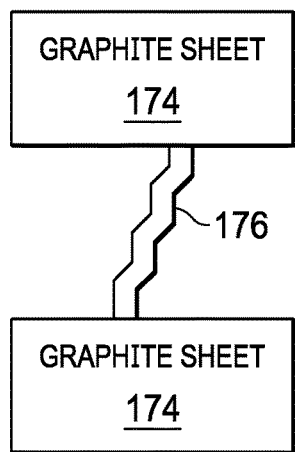
FIG. 29 depicts opposing graphite thermal spreaders interfaced through a strip that supports multiple wraps around a hinge pin or shaft.

Referring now to FIG. 29, opposing graphite thermal spreaders 170 interface through a strip 176 that supports multiple wraps around a hinge pin or shaft. In the example embodiment, first and second graphite sheets 174 are cut to substantially the same area as the lid and main housing portions. For instance, each graphite sheet 174 couples to a perimeter of one of the housing portions to transfer thermal energy across the graphite, resulting in a more consistent temperature across each housing portion. Strip 176 couples the opposing graphite sheets 174 to each other so that thermal states between the graphite sheets 174 and their associated housing portions tend towards equalization. Strip 176 has a length that provides for multiple wraps around a hinge shaft or other structure between the housing portions. In the example embodiment with a graphite thermal spreader that has limited out-of-plane thermal conductance, multiple wraps of strip 176 provide additional material to hold transient surges in thermal energy without release at the hinge.

Figure 30:
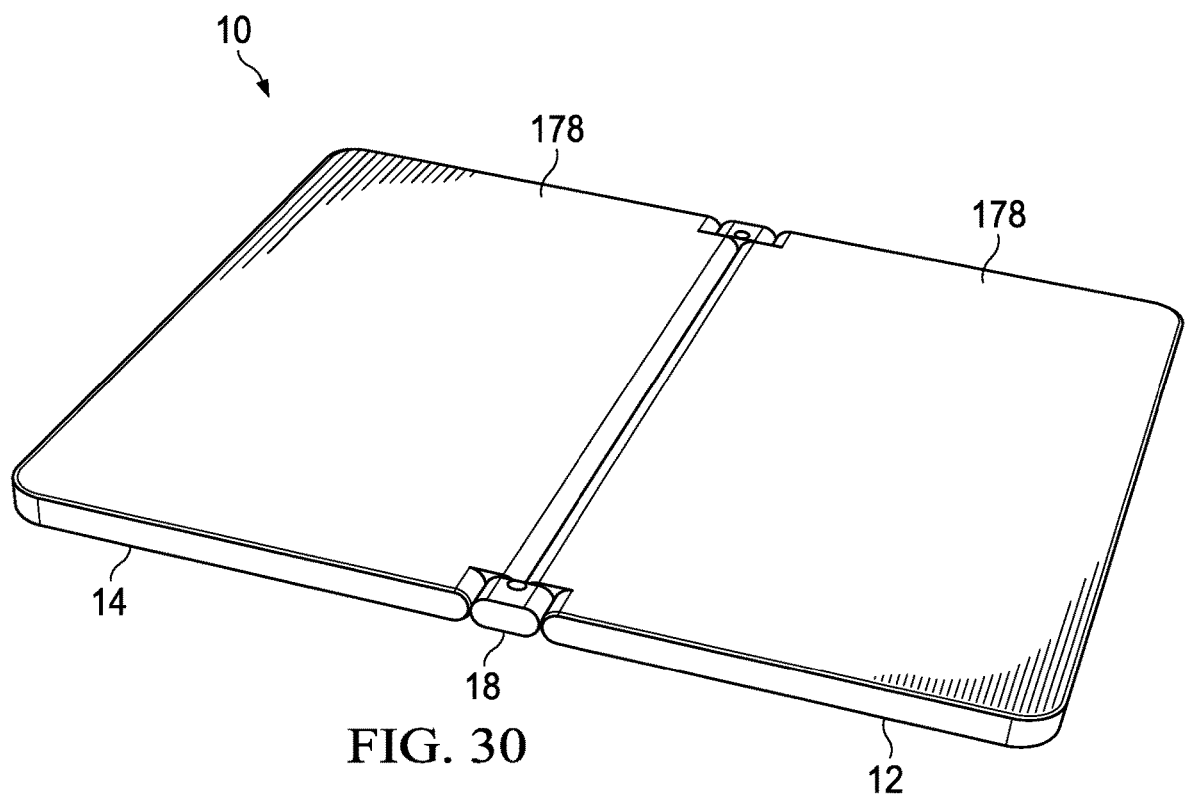
FIG. 30 depicts a side perspective view of an information handling system having graphite thermal spreaders extended across substantially all first and second rotationally coupled housing portions.

Referring now to FIG. 30, a side perspective view depicts an information handling system 10 having graphite thermal spreaders 178 extended across substantially all of first and second rotationally coupled housing portions 12 and 14. In the example embodiment, graphite thermal spreader 178 is a contiguous sheet of one or more layers of graphite that efficiently transfer thermal energy in plane. Information handling system 10 has housing portions 12 and 14 rotated about a hinge 18 to a tablet configuration. Graphite thermal spreader 178 passes between housing portions 12 and 14 to spread thermal energy generated at information handling system 10 across both housing portions, thus averaging down the system temperature for a given thermal state. As an example, thermal spreader 178 thermally couples to each housing portion 12 and 14 so that an imbalance in temperature between the housing portions is evened out by thermal energy transfer through thermal spreader 178. As is set forth in greater detail below, a tensioning mechanism located between housing portions 12 and 14 maintains tension at thermal spreader 178 so that the graphite material folds and adjusts during rotation of the housing portions.

Figure 31:
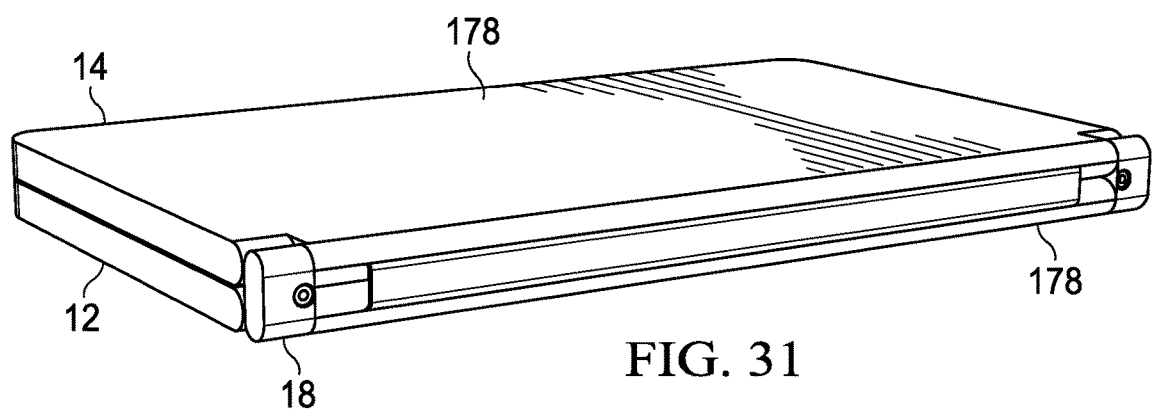
FIG. 31 depicts a side perspective view of the information handling system having the housing portions rotated to a closed position.

Referring now to FIG. 31, a side perspective view depicts the information handling system 10 having the housing portions 12 and 14 rotated to a closed position. Graphite thermal spreader 178 has to have a greater length in the closed configuration compared to the tablet configuration depicted by FIG. 30 due to the greater circumference around the housing portions at the outer surface. A tensioning mechanism associated with hinge 18 adjusts the length of graphite thermal spreader 178 by releasing part of graphite thermal spreader 178 from a folded condition in the tablet configuration to an extended position in the closed configuration. Graphite thermal spreader 178 has substantially the same area as the rotationally coupled housing portions with each portion coupled at its perimeter to spreader 178. Some parts of graphite thermal spreader 178 have openings and connection points that leave uncovered parts of housing portions 12 and 14. In the example embodiment, openings between the ends of hinge 18 and thermal spreader 178 are made to support hinge movement. Other examples of uncovered parts might include connection locations to heat producing components, openings for cable crossings, and room to fit housing covers, displays, control buttons etc . . . Generally, with these and similar exceptions, having thermal spreader 178 substantially the same area as the housing portions provides a larger surface area over which thermal energy may be distributed.

Figure 32:
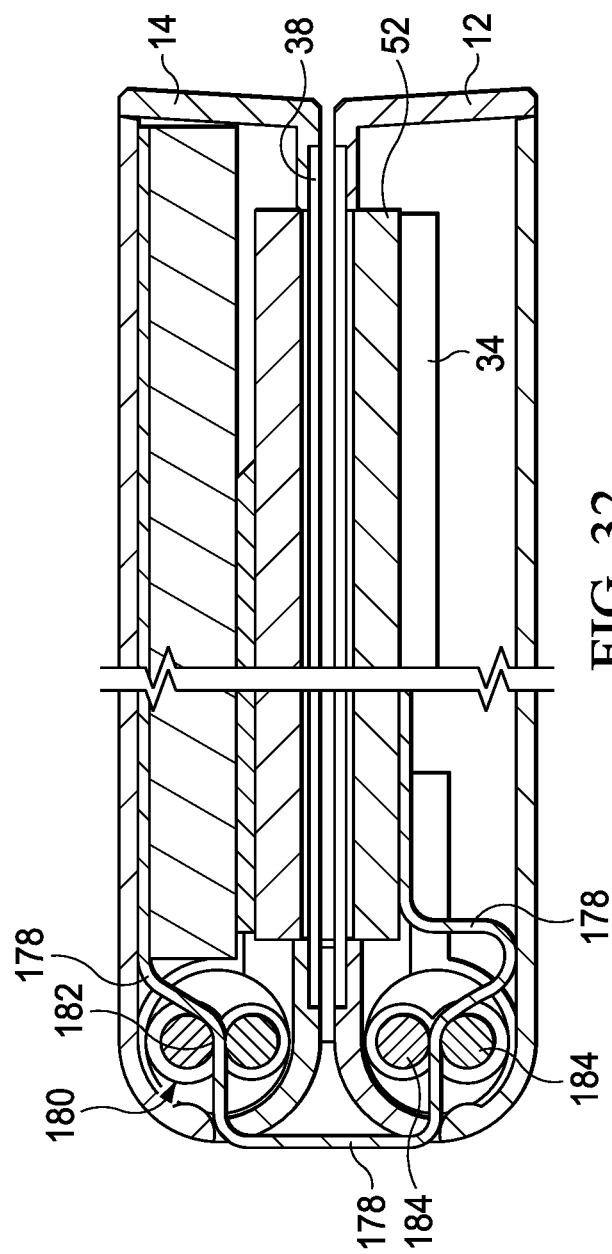
FIG. 32 depicts a side cutaway view of an information handling system graphite thermal spreader managed in a closed configuration by a tensioning assembly.

Referring now to FIG. 32, a side cutaway view of information handling system 10 depicts graphite thermal spreader 178 managed in a closed configuration by a tensioning assembly 180. In the example embodiment, graphite thermal spreader 178 is disposed proximate the outer surface of lid housing portion 14 and thermally interfaced with material of lid housing portion 14 at the end of the housing distal tensioning assembly 180. Proximity of thermal spreader 178 to lid housing portion 14 aids transfer of thermal energy to lid housing portion 14 for dissipation across the housing material and rejection to the external environment. In the example embodiment, lid housing portion 14 typically has less thermal energy released than main housing portion 12 and is thus configured primarily to receive and dissipate the thermal energy. Main housing portion 12 includes processing components that use and dissipate power to create thermal energy, such as a CPU. A vapor chamber 34 thermally interfaces with the processing components to dissipate the thermal energy across main housing portion 12 and also thermally interfaces with graphite thermal spreader 178 to transfer thermal energy through tensioning assembly 180 to lid housing portion 14. As set forth above, graphite thermal spreader may be assembled as a composite of multiple layers of graphite sheets coupled with adhesive and transferring thermal energy by coupling to heat sources and sinks in plane with enhanced thermal conductivity at independent locations.

In the example embodiment, graphite thermal spreader 178 has its tension and bend radius managed by first and second sets of parallel tension bars 184 that define a slot through which graphite thermal spreader 178 passes. In the closed configuration, parallel tension bars 184 are vertically stacked to pull graphite thermal spreader 178 towards the hinge side of information handling system 10 so that sufficient material is available for thermal spreader 178 to pass between main housing portion 12 and lid housing portion 14. As is set forth below in greater detail, tensioning assembly 180 integrates a clutch that provides rotation of parallel tensioning bars 184 independent of housing orientation so that tension across thermal spreader 178 is maintained over variations in material size and wear.

Figure 33:
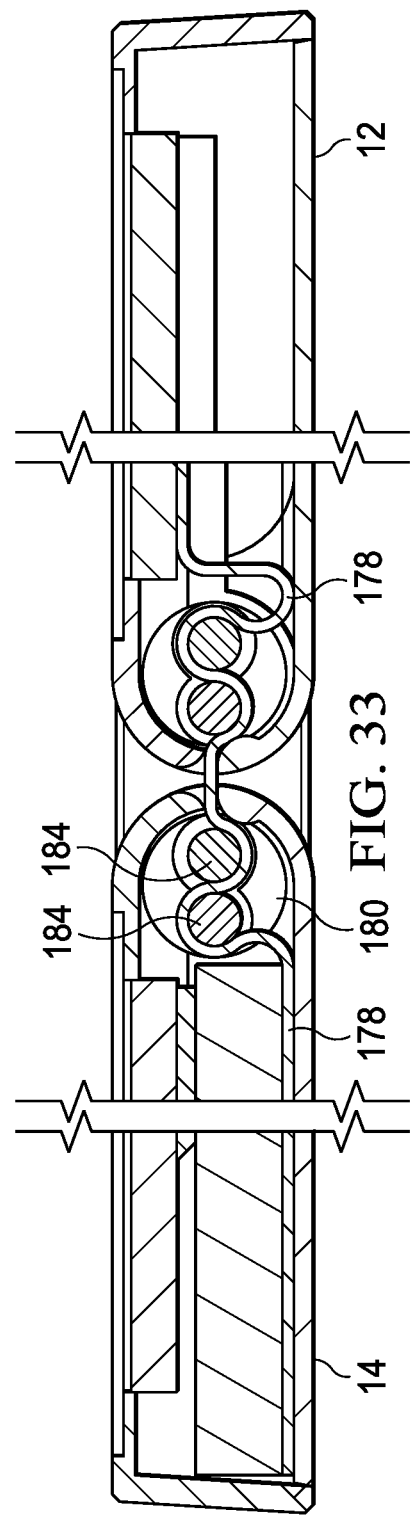
FIG. 33 depicts a side cutaway view of an information handling system graphite thermal spreader managed in a tablet configuration by a tensioning assembly.

Referring now to FIG. 33, a side cutaway view depicts information handling system 10 graphite thermal spreader 178 managed in a tablet configuration by a tensioning assembly 180. Thermal spreader 178 remains disposed in lid housing portion 14 proximate the outer surface and in main housing portion 12 near heat-generating processing components and vapor chamber 34. Tensioning assembly 180 has rotated so that thermal spreader 178 wraps around parallel tension bars 184 to control excess material of thermal spreader 178. The amount of material between housing portions 12 and 14 is diminished due to the reduced outer circumference followed by thermal spreader 178. A bend radius of thermal spreader 178 is maintained by the radius of tension bars 184 so that undue stress is not place upon graphite thermal spreader 178 that might lead to cracking or breaking. In one alternative embodiment, tensioning assembly 180 manages thermal spreader 178 during rotation from the flat tablet configuration depicted in FIG. 33 to a folded tablet configuration in which lid housing portion 14 rotates 360 degrees relative to main housing portion.

Figure 34:
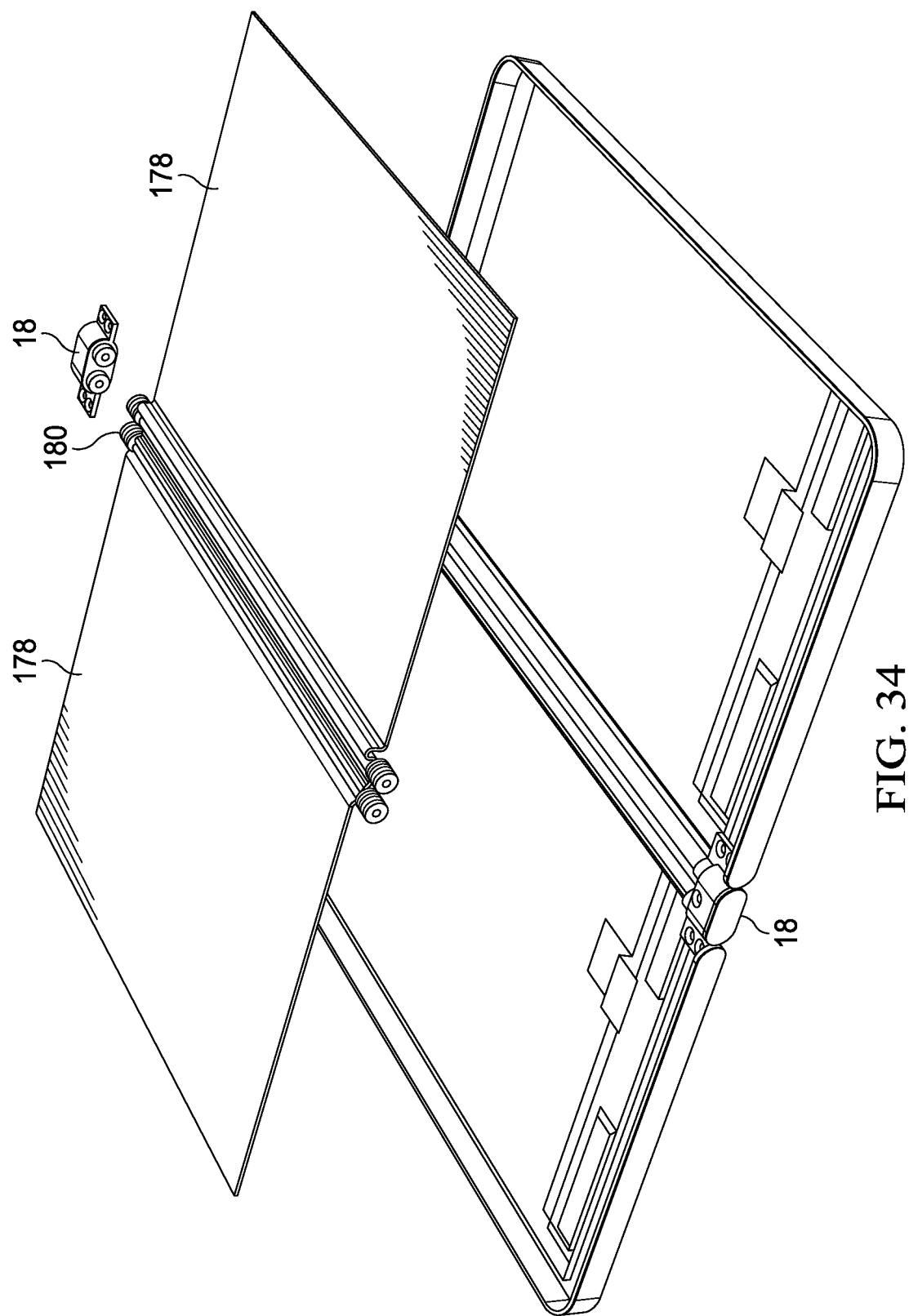
FIG. 34 depicts an upper perspective exploded view of a graphite thermal spreader aligned to couple with an information handling system.

Referring now to FIG. 34, an upper perspective exploded view depicts a graphite thermal spreader 178 aligned to couple with an information handling system 10. In the example embodiment, a hinge 18 rotationally couples first and second housing portions to each other, such as with a dual axis 360 degree synchronized motion. First and second tensioning assemblies 180 each include first and second parallel tension bars 184 that define a slot 182 through which graphite thermal spreader 178 inserts. Each tension assembly 180 aligns with a hinge axis on opposing sides of information handling system 10. In one example embodiment, thermal spreader 178 assembles into the tensioning assemblies 180 for subsequent assembly into information handling system 10. Tension assemblies 180 snap into position on hinges 18 and then graphite thermal spreader 178 thermally couples to fixed locations of housing portions 12 and 14, such as with an adhesive.

Figure 35:
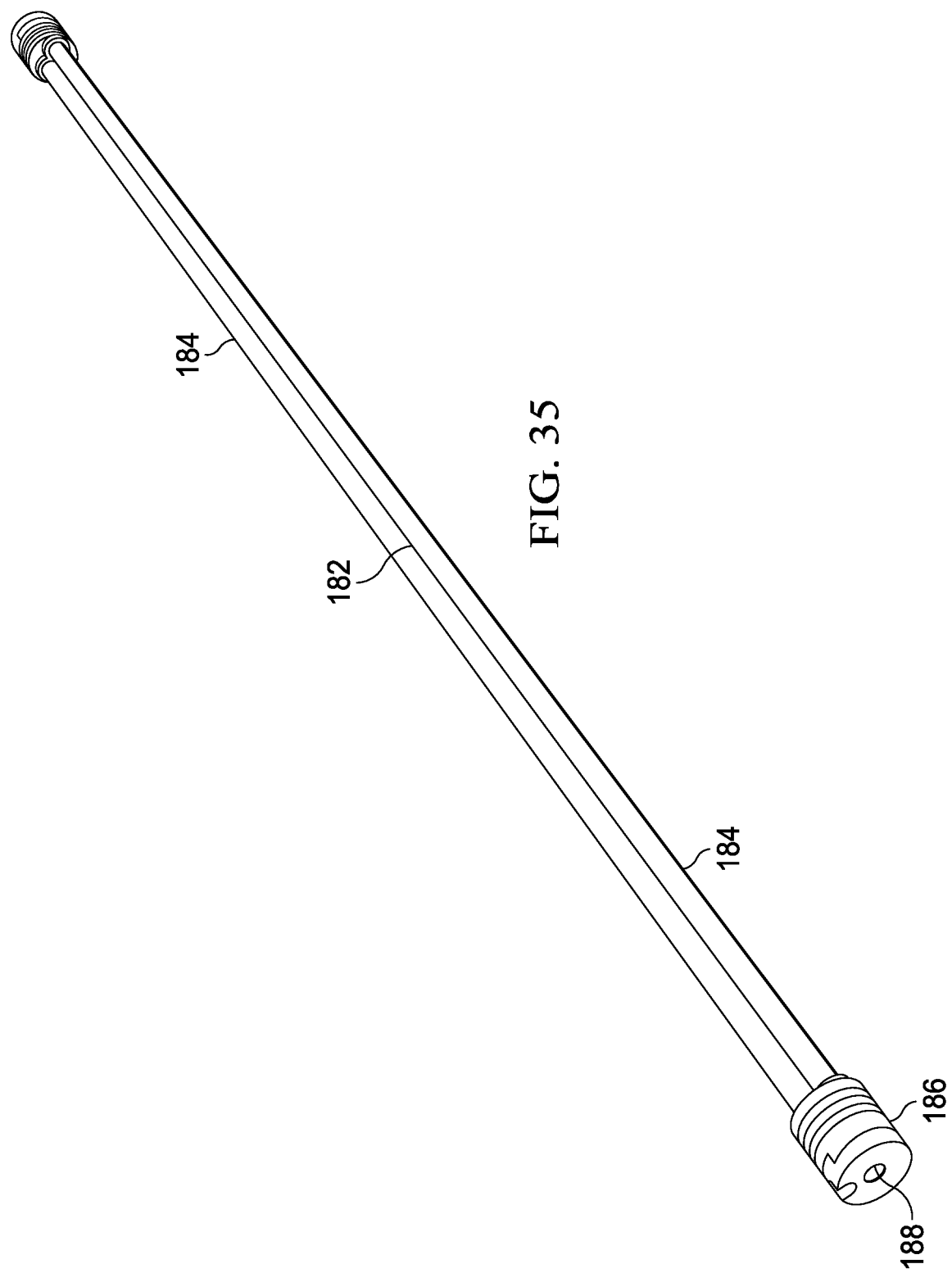
FIG. 35 depicts an upper perspective view of a parallel tension bar assembly configured to rotate with a thermal spreader captured in a slot to maintain tension across the thermal spreader.

Referring now to FIG. 35, an upper perspective view depicts a parallel tension bar assembly 180 configured to rotate with a thermal spreader captured in a slot 182 to maintain tension across the thermal spreader 178. A connector assembly 186 couples to each end of the parallel bar assembly 180 to hold parallel tension bars 184 in place. A pin opening 188 at the outside surface of connector 186 couples to a pin extending from a hinge 18, as described below.

Figure 36:
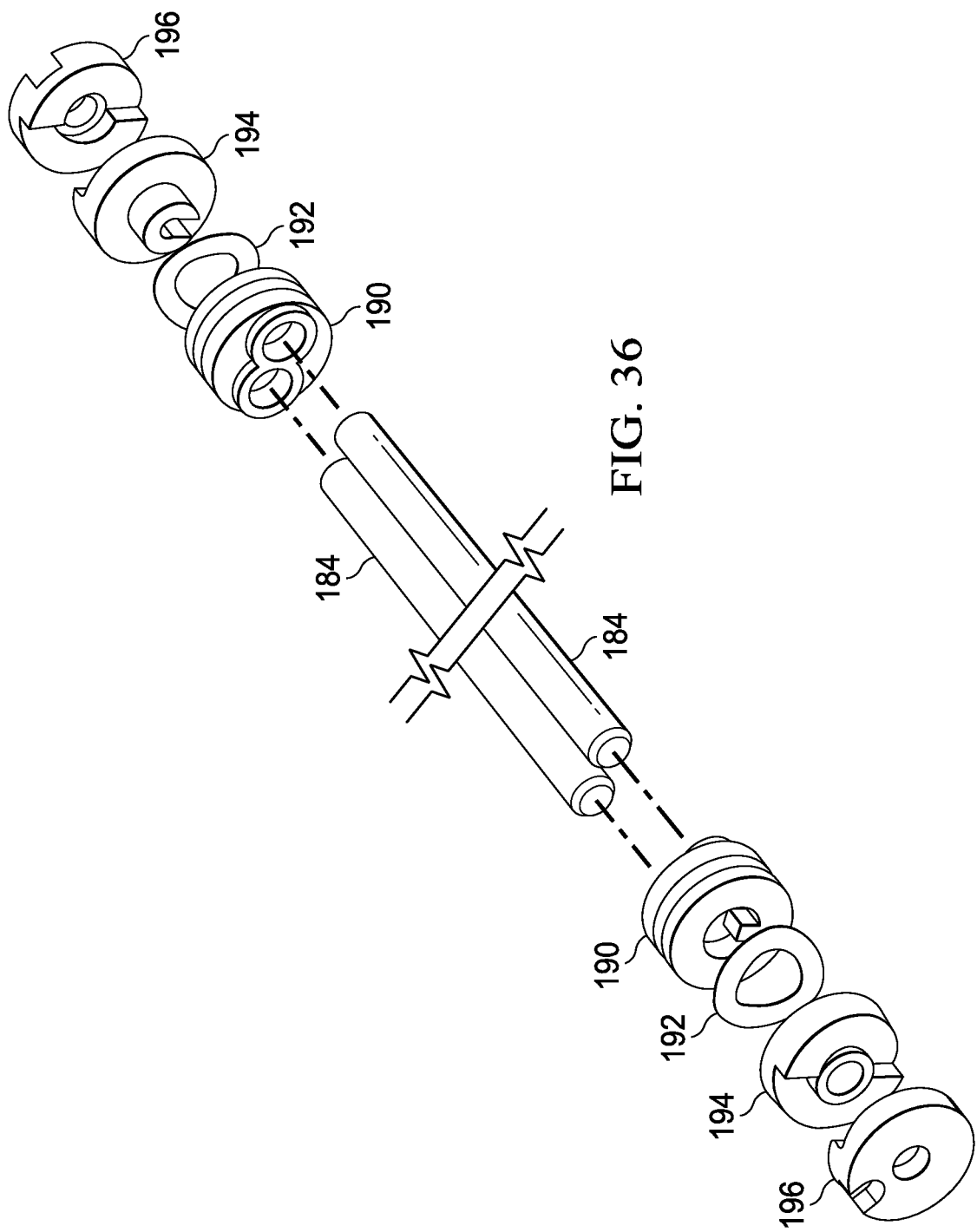
FIG. 36 depicts an exploded view of both ends of a parallel tension bar assembly having a clutch assembly that adapts tensioning bar orientation to variations in thermal spreader tension.

Referring now to FIG. 36, an exploded view of both ends of parallel tension bar assembly 180 depicts a clutch assembly that adapts tensioning bar orientation to variations in thermal spreader tension. In the example embodiment, a spring 192 works through ramped surfaces to bias graphite thermal spreader 178 to a tightened condition. Parallel tension bars 184 insert into a base 190 of connector 186. A wave spring 192 bias apart a flat surface of base 190 and an inner ramp piece 194. A ramped surface of inner ramp piece 194 engages against an opposing ramped surface of outer ramp piece 196 so that pieces 194 and 196 work against wave spring 192 when their relative rotational orientation changes, such as during rotation of connector 186. Wave spring 192 and ramped surfaces on pieces 194 and 196 interact to create a clutch that allows rotation of parallel tension bars 184 independent of hinge 18 with an increased spring compression as the rotational angle increases. Increased spring compression forces the ramped surfaces to return to an aligned position so that, as parallel tension bars 184 align with hinge 18, the tension placed on thermal spreader 178 decreases. The persistent ramp and spring interactions tend to maintain at least a minimal tension working against thermal spreader 178 at all times.

Referring now to FIGS. 37A and 37B, an example of tension adjustments applied by the tensioning bar clutch assembly is depicted. FIG. 37A depicts hinge 18 rotated 180 degrees to an open tablet configuration so that both housing portions rest in a common plane. As shown in the accompanying cutaway view, parallel torsion bars 184 are aligned with hinge 18 axes in the same plane as the housing portions. The clutch assembly in connector 186 has biased parallel torsion bars 184 to have the same orientation as hinge 18 axes. FIG. 37B depicts hinge 18 in the same 180 degree rotation as FIG. 37A, however, connector 186 has rotated slightly to adjust tension on thermal spreader 178. Parallel torsion bars 184 are rotated out of alignment with hinge axes 18 so that each outer bar is raised slightly. In one example embodiment, a limit of approximately 15 degrees is built into the clutch assembly, such as in the opposing ramps, so that parallel torsion bars 184 rotate independently of hinge 18 only up to the limit.

Figure 38:
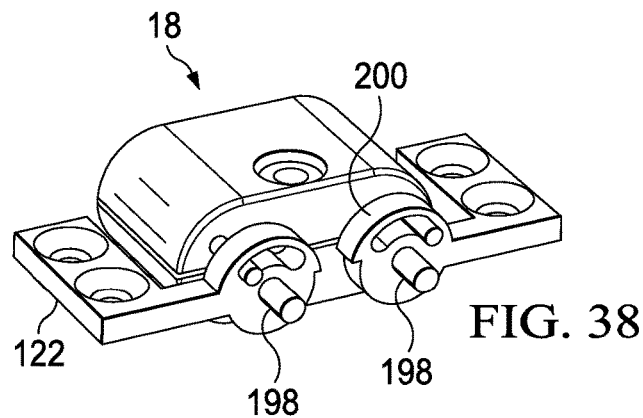
FIG. 38 depicts an exploded view of a hinge configured to couple with a parallel tension bar assembly.

Referring now to FIG. 38, an exploded view depicts a hinge 18 configured to couple with a parallel tension bar assembly. Hinge 18 couples to each housing portion 12 and 14 with opposing brackets 122. Each bracket 122 couples to an axis of hinge 18 where, in the example embodiment, movement of each axis is synchronized with a synchronization mechanism within hinge 18, such as gears. In the example embodiment, a pin 198 extends outward from each hinge axle to insert into an opening of connector 186, thus allowing connector 186 to rotate about pin 198. Connector 186 is held in position between opposing hinges by coupling of hinges 18 to housing portions 12 and 14 so that parallel tension bars cannot slide laterally to remove pin 198 from connector 186. A rotation limiting device 200 includes an eye opening and second pin located at the perimeter of the hinge axle that restricts independent movement of connector 186 relative to hinge 18. Rotation limiting device 200 inserts into an opening of outer ramp piece 196 of connector 186. The position of rotation limiting device 200 is maintained relative to bracket 122 so that at a rotation limit bracket 122 motion is translated to connector 186. Within a rotation limit, the orientation of connector 186 relative to the orientation of bracket 122 varies based upon the amount of tension on thermal spreader 178 and the ramp 194 and 196 with spring 192 interactions of the clutch mechanism.

Figure 39:
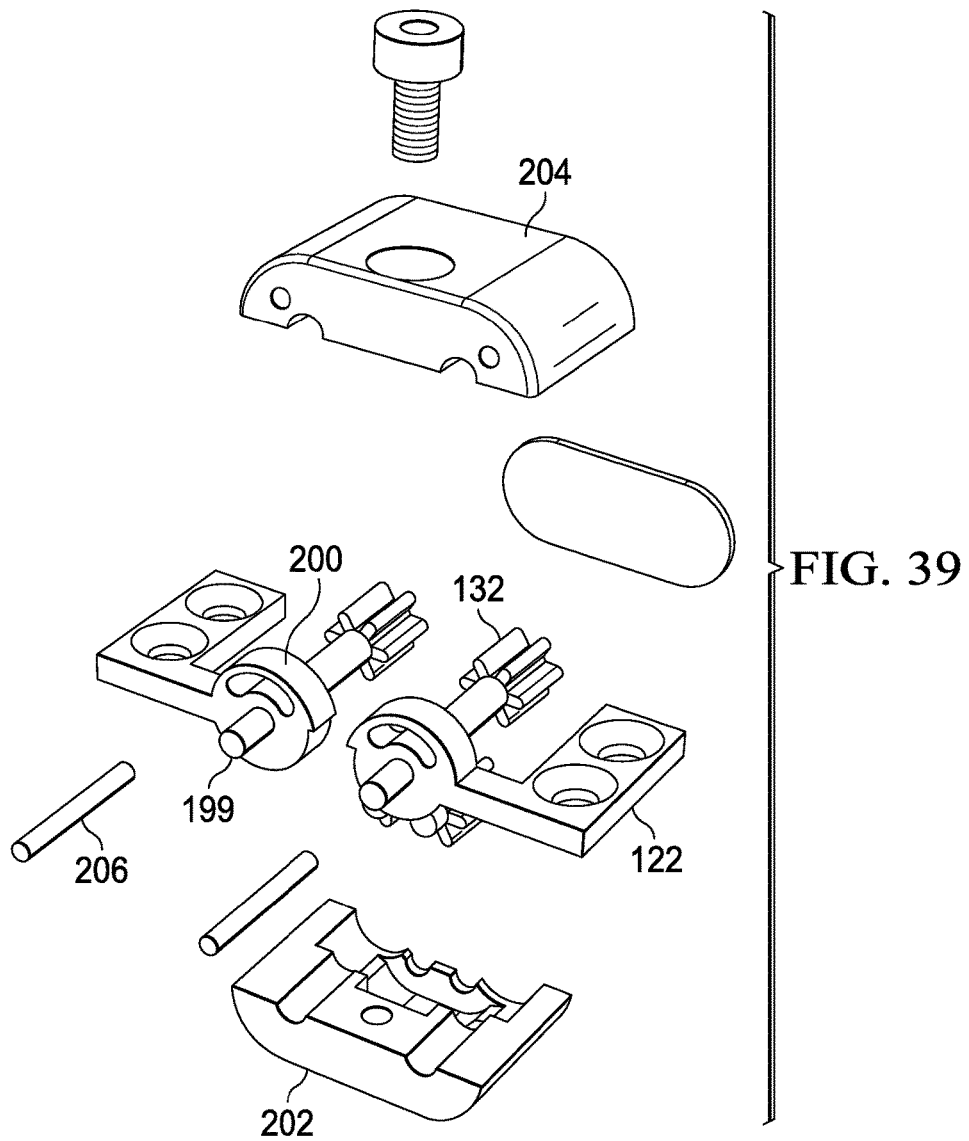
FIG. 39 depicts an exploded view of a hinge configured to couple with a parallel tension bar assembly.

Referring now to FIG. 39, an exploded view depicts a hinge configured to couple with a parallel tension bar assembly. Synchronized axle motion is provided by a gear 132 coupled to each bracket 122 and interconnected by an intermediate gear not shown. The brackets 122 and gears 132 are held in position by opposing gear housings 202 and 204 that couple to each other with a screw or other coupling device. A rotation limiting pin 206 inserts through an eye formed in each axle proximate center pin 198. Rotation limiting pin 206 slides in an arc about center pin 198, such as with rotation of connector 186 coupled to pin 198. The interaction of rotation limiting pin 206 and the arc opening at each axle defines the rotation limiting device that keeps the torsion bar assembly within a rotational orientation limit of hinge 18 axle rotational orientation.

In various embodiments, the present disclosure provides a flexible tool that adapts information handling system housing portions to spread, dissipate and reject excess thermal energy efficiently and passively. Low profile information handling systems have minimal vertical height to contain processing components, however, housing length and width are typically driven by display screen size. Thermal transfer between housing portions allows greater flexibility for the distribution of processing components across a system's length and width by avoiding thermal concentrations at housing locations that include heat producing processing components, such as a CPU and/or GPU. For example, by managing the direction and amount of thermal transfer between housing portions, housing outer surface temperatures may be actively controlled through adaptive passive thermal transfer. Such control provides improved processing component operations so that thermal energy generation can increase to provide greater processing power where thermal transfer between housing portions is available. In some instances, such as where a docking station or extra battery pack is connected to a housing portion, thermal dissipation and rejection capabilities of a housing portion change so that control of thermal transfer adapts processing capabilities at an information handling system to different thermal configurations. As an example, a dual screen information handling system having a foldable OLED display disposed across both housing portions allows an end user to select either housing portion as a "keyboard" main portion to accept typed inputs at a keyboard presented on a display at one of the housing portions. By controlling the direction of thermal transfer between the housing portions, the keyboard portion may transfer thermal energy to the other "display" portion so that housing surface temperatures near the end user are reduced while thermal rejection at a vertically raised "display" portion is improved. Thus, dual screen devices that have a display over both housing portions more readily adapt to end user selection of either of the housing portions as the keyboard input portion or display portion. If an end user flips the information handling system, for instance, reversal of thermal energy transfer between the housing portions adapts to the end user's selection of a housing portion for keyboard versus display functionality.

Although the present invention has been described in detail, it should be understood that various changes, substitutions and alterations can be made hereto without departing from the spirit and scope of the invention as defined by the appended claims.

What is claimed is:

1. An information handling system comprising: a first housing portion configured to hold a display;
    a display integrated in the first housing portion and operable to present visual images;
    a thermal energy sink disposed in the first housing portion;
    a second housing portion configured to hold plural processing components;
    the plural processing components disposed in the second housing portion and operable to process information to define visual images for presentation at the display;
    a vapor chamber thermally coupled to one or more of the plural processing components, the vapor chamber configured to draw fluid towards the one or more of the processing components, vaporize the fluid with thermal energy of the one or more of the processing components, and distribute the vaporized fluid away from the one or more of the plural processing components;
    a hinge assembly having first and second hinges, the hinge assembly rotationally coupling the first and second housing portions to each other;
    a first thermal conduit coupled to the vapor chamber and the first hinge to transfer thermal energy from the vapor chamber to the first hinge;
    a second thermal conduit coupled to the thermal energy sink and the first hinge to transfer thermal energy from the first hinge to the thermal energy sink; and
    a thermally conductive interface integrated in the first hinge and thermally coupled to the first and second thermal conduits to transfer thermal energy from the first thermal conduit to the second thermal conduit, the thermally conductive interface further comprises:
        a thermally conductive hinge body having first and second cavities, the first thermal conduit engaged in the first cavity, the second thermal conduit engaged in the second cavity; and
        a thermally conductive grease captured in each of the first and second cavities to transfer thermal energy from the first conduit through the hinge body to the second conduit,
    wherein each of the first and second thermal conduits have fins, the fins extend into the thermally conductive grease within the hinge body, the fins interacting with the thermally conductive grease during rotation of the first and second housing portions relative to each other.

2. The information handling system of claim 1 further comprising a vapor chamber integrated in the hinge body and containing a fluid, the vapor chamber transferring thermal energy from the first thermal conduit to the second thermal conduit.

3. The information handling system of claim 1 wherein the first and second thermal conduits comprise vapor chambers, the first thermal conduit transitioning liquid to vapor at the one or more of the processing components, the second thermal conduit transitioning the liquid to the vapor at the first hinge.

4. The information handling system of claim 3 further comprising an actuator interfaced with the second thermal conduit and operable to adjust the saturation point within the second thermal conduit.

5. The information handling system of claim 1 wherein the thermal energy sink comprises a battery interfaced with the second thermal conduit.

6. The information handling system of claim 1 wherein the thermal energy sink comprises a vapor chamber interfaced with the second thermal conduit.

7. A method for thermal management of an information handling system, the method comprising:
    capturing thermal energy released by a processor at a first housing portion of the information handling system;

translating the thermal energy through a first thermal conduit to a hinge coupling the first housing portion to a second housing portion;

translating the thermal energy through a thermally-conductive interface integrated in the hinge;

translating the thermal energy from the hinge through a second thermal conduit to a thermal energy sink disposed in a second housing portion coupled by the hinge to the first housing portion, wherein the translating the thermal energy through the thermally-conductive interface integrated in the hinge further comprises:

routing the first thermal conduit into a first cavity of a hinge body of the hinge;

routing the second thermal conduit into a second cavity of the hinge body; and translating the thermal energy from the first thermal conduit to the second thermal conduit through the hinge body;

filling each of the first and second cavities with a thermally-conductive grease; and extending fins from each of the first and second thermal conduits into the thermally conductive grease within the hinge body, the fins interacting with the thermally conductive grease during rotation of the first and second housing portions relative to each other.

8. The method of claim 7 further comprising:

disposing a vapor chamber in the hinge body, a fluid disposed in the vapor chamber for the transferring the thermal energy from the first thermal conduit to the second thermal conduit.

9. The method of claim 7 wherein the first and second thermal conduits comprise vapor chambers, the second thermal conduit having a lower saturation point than the first thermal conduit.

10. A system for thermal management of a portable information handling system, the system comprising:

a hinge assembly having first and second hinges;

a first main housing portion thermal conduit and a second main housing portion thermal conduit, the first main housing portion thermal conduit coupled to the first hinge, the second main housing portion thermal conduit coupled to the second hinge;

a first lid housing portion thermal conduit and a second lid housing portion thermal conduit, the first lid housing portion thermal conduit coupled to the first hinge, the second lid housing portion thermal conduit coupled to the second hinge;

a first thermally conductive interface integrated in the first hinge to thermally couple the first main housing portion thermal conduit and the first lid housing portion thermal conduit at the first hinge to transfer first thermal energy from the main housing portion thermal conduit to the lid housing portion thermal conduit; and a second thermally conductive interface integrated in the second hinge to thermally couple the second main housing portion thermal conduit and the second lid housing portion thermal conduit at the second hinge to transfer second thermal energy from the second main housing portion thermal conduit to the second lid housing portion thermal conduit, wherein the first thermally conductive interface comprises a hinge body having first and second cavities, the first main housing portion thermal conduit inserted in the first cavity, the first lid housing portion thermal conduit inserted in the second cavity, thermal energy transferring from the first cavity to the second cavity, the hinge body rotating relative to each of the first main housing portion thermal conduit and the first lid housing portion thermal conduit, a thermally conductive grease captured in each of the first and second cavities to transfer the first thermal energy from the first main housing portion thermal conduit through the hinge body to the first lid housing portion thermal conduit, wherein each of the first main housing portion thermal conduit and the first lid housing portion thermal conduit comprise fins, each of the fins extend into the thermally conductive grease within the hinge body, the fins interacting with the thermally conductive grease during rotation of the first and second housing portions relative to each other.

11. The system of claim 10 further comprising a vapor chamber integrated in the hinge body and containing a fluid, the vapor chamber transferring thermal energy from the first main housing portion thermal conduit to the first lid housing portion thermal conduit.

12. An information handling system comprising:

a first housing portion configured to hold a display;

a display integrated in the first housing portion and operable to present visual images;

a thermal energy sink disposed in the first housing portion;

a second housing portion configured to hold plural processing components;

the plural processing components disposed in the second housing portion and operable to process information to define visual images for presentation at the display;

a vapor chamber thermally coupled to one or more of the plural processing components, the vapor chamber configured to draw fluid towards the one or more of the processing components, vaporize the fluid with thermal energy of the one or more of the processing components, and distribute the vaporized fluid away from the one or more of the plural processing components;

a hinge assembly having first and second hinges, the hinge assembly rotationally coupling the first and second housing portions to each other;

a first thermal conduit coupled to the vapor chamber and the first hinge to transfer thermal energy from the vapor chamber to the first hinge;

a second thermal conduit coupled to the thermal energy sink and the first hinge to transfer thermal energy from the first hinge to the thermal energy sink; and a thermally conductive interface integrated in the first hinge and thermally coupled to the first and second thermal conduits to transfer thermal energy from the first thermal conduit to the second thermal conduit, wherein the thermally conductive interface further comprises:

a hinge body having a single cavity, the first and second thermal conduits engaged in the single cavity; and a liquid disposed in the single cavity, the liquid transferring thermal energy from the first thermal conduit to the second thermal conduit, wherein each of the first and second thermal conduits have fins extending into the liquid within the hinge body, the fins interacting with the liquid during rotation of the first and second housing portions relative to each other.

13. The information handling system of claim 12 wherein the first and second thermal conduits comprise vapor chambers, the first thermal conduit transitioning liquid to vapor at the one or more of the processing components, the second thermal conduit transitioning the liquid to the vapor at the first hinge.

14. The information handling system of claim 13 further comprising an actuator interfaced with the second thermal conduit and operable to adjust the saturation point within the second thermal conduit.

15. The information handling system of claim 12 wherein the thermal energy sink comprises a battery interfaced with the second thermal conduit.

16. The information handling system of claim 12 wherein the thermal energy sink comprises a vapor chamber interfaced with the second thermal conduit.

17. A method for thermal management of an information handling system, the method comprising:
   capturing thermal energy released by a processor at a first housing portion of the information handling system;
   translating the thermal energy through a first thermal conduit to a hinge coupling the first housing portion to a second housing portion;
   translating the thermal energy through a thermally-conductive interface integrated in the hinge;
   translating the thermal energy from the hinge through a second thermal conduit to a thermal energy sink disposed in a second housing portion coupled by the hinge to the first housing portion,
   routing the first and second thermal conduits into a single cavity of a hinge body of the hinge;
   translating the thermal energy from the first thermal conduit to the second thermal conduit through a fluid disposed in the single cavity, and
   extending fins from each of the first and second thermal conduits into the fluid within the hinge body, the fins interacting with the fluid during rotation of the first and second housing portions relative to each other.

18. The method of claim 17 wherein:
   the capturing the thermal energy comprises interfacing a first vapor chamber with the processor, the first vapor chamber having a first saturation point and configured to convert a vapor to a liquid proximate the hinge; and
   the translating the thermal energy from the hinge through the second thermal conduit to the thermal energy sink further comprises translating the thermal energy from the second thermal conduit to a second vapor chamber having a second saturation point of less than the first saturation point.

19. The method of claim 17 wherein the first and second thermal conduits comprise vapor chambers, the second thermal conduit having a lower saturation point than the first thermal conduit.

20. A system for thermal management of a portable information handling system, the system comprising:
   a hinge assembly having first and second hinges;
   a first main housing portion thermal conduit and a second main housing portion thermal conduit, the first main housing portion thermal conduit coupled to the first hinge, the second main housing portion thermal conduit coupled to the second hinge;
   a first lid housing portion thermal conduit and a second lid housing portion thermal conduit, the first lid housing portion thermal conduit coupled to the first hinge, the second lid housing portion thermal conduit coupled to the second hinge;
   a first thermally conductive interface integrated in the first hinge to thermally couple the first main housing portion thermal conduit and the first lid housing portion thermal conduit at the first hinge to transfer first thermal energy from the main housing portion thermal conduit to the lid housing portion thermal conduit; and
   a second thermally conductive interface integrated in the second hinge to thermally couple the second main housing portion thermal conduit and the second lid housing portion thermal conduit at the second hinge to transfer second thermal energy from the second main housing portion thermal conduit to the second lid housing portion thermal conduit,
   wherein the thermally conductive interface comprises a hinge body having a single cavity, the first main housing portion thermal conduit and the first lid housing portion thermal conduit inserted in the single cavity, the single cavity filled with a liquid to transfer the first thermal energy from the first main housing portion thermal conduit to the first lid housing portion thermal conduit, and
   wherein each of the first main housing portion thermal conduit and the first lid housing portion thermal conduit have fins extending into the liquid within the hinge body, the fins interacting with the liquid during rotation of the first and second housing portions relative to each other.

* * * * *